US012795983B2

(12) United States Patent
Lee et al.

(10) Patent No.: US 12,795,983 B2
(45) Date of Patent: Nov. 10, 2026

(54) SEMICONDUCTOR DEVICE

(71) Applicant: Samsung Electronics Co., Ltd., Suwon-si (KR)

(72) Inventors: Doohyun Lee, Hwaseong-si (KR); Heonjong Shin, Yongin-si (KR); Minchan Gwak, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 977 days.

(21) Appl. No.: 17/679,361

(22) Filed: Feb. 24, 2022

(65) Prior Publication Data

US 2022/0399449 A1 Dec. 15, 2022

(30) Foreign Application Priority Data

Jun. 15, 2021 (KR) ........................ 10-2021-0077289

(51) Int. Cl.

| | |
|---|---|
| ***H10D 30/62*** | (2025.01) |
| ***H10D 62/10*** | (2025.01) |
| ***H10W 20/42*** | (2026.01) |

(52) U.S. Cl.

CPC ..... *H10D 30/6219* (2025.01); *H10D 30/6211* (2025.01); *H10D 62/115* (2025.01); *H10W 20/42* (2026.01)

(58) Field of Classification Search

CPC ............. H10D 30/6219; H10D 62/115; H10D 84/0107; H10D 84/144; H10D 84/0188; H10D 84/201; H10D 30/6211–6213; H10D 84/0193; H10D 84/853; H10D 84/013; H10D 84/017; H10D 62/378; H10D 64/529; H10D 64/251–259; H10D 30/6729–6739; H10D 64/647–649; H10D 30/0212–0213; H10D 30/794; H01L 23/5226; H01L 21/7682;

(Continued)

(56) References Cited

U.S. PATENT DOCUMENTS 9,305,878 B2 * 4/2016 Huisinga ........... H01L 21/76849
9,685,340 B2 6/2017 Ok et al.

(Continued)

FOREIGN PATENT DOCUMENTS

KR 10-2020-0000720 A 1/2020
KR 10-2020-0026404 A 3/2020

(Continued)

*Primary Examiner* — Steven H Loke
(74) *Attorney, Agent, or Firm* — Wolf, Greenfield & Sacks, P.C.

(57) ABSTRACT

A semiconductor device includes an active region on a substrate, gate structures intersecting the active region on the substrate, source/drain regions on both sides of the gate structures, a contact structure in a contact hole exposing the source/drain regions, the contact structure comprising a barrier layer and a plug layer, and an insulating pattern in a remaining space of the contact hole, wherein the contact structure includes a first portion filling a lower portion of the contact hole and a second portion protruding from a region of the first portion, the plug layer extends continuously from the first portion to the second portion, and the barrier layer of the second portion has upper ends at a level lower than an upper surface of the plug layer of the second portion on both sides of the plug layer of the second portion.

19 Claims, 24 Drawing Sheets

(58) Field of Classification Search
CPC ......... H01L 21/76834; H01L 21/76843; H01L 21/76865; H01L 23/485; H01L 23/481; H01L 23/5283; H01L 21/76877; H10W 20/42; H10F 30/2857; H10F 99/00; H10H 20/826; H10H 20/8314
See application file for complete search history.

(56) References Cited

U.S. PATENT DOCUMENTS

| | | | |
|---|---|---|---|
| 10,002,789 B2 | 6/2018 | Adusumilli et al. | |
| 10,629,496 B2 | 4/2020 | More et al. | |
| 2010/0015805 A1 | 1/2010 | Mayer et al. | |
| 2015/0179662 A1 | 6/2015 | Makala et al. | |
| 2017/0077033 A1 | 3/2017 | Lin et al. | |
| 2019/0334008 A1 | 10/2019 | Chen et al. | |
| 2019/0393318 A1 | 12/2019 | Chung et al. | |
| 2020/0127089 A1* | 4/2020 | Hsu | H01L 23/53266 |
| 2021/0098365 A1* | 4/2021 | Chou | H10D 30/797 |
| 2021/0104612 A1* | 4/2021 | Bae | B82Y 10/00 |
| 2021/0217861 A1* | 7/2021 | Song | H01L 23/5226 |
| 2021/0384192 A1* | 12/2021 | Bae | H10D 84/853 |
| 2022/0190161 A1* | 6/2022 | Miller | H10D 30/024 |

FOREIGN PATENT DOCUMENTS

| | | |
|---|---|---|
| KR | 10-2020-0042563 A | 4/2020 |
| KR | 10-2021-0042222 A | 4/2021 |
| KR | 10-2021-0053153 A | 5/2021 |
| KR | 10-2021-0055139 A | 5/2021 |

* cited by examiner

SEMICONDUCTOR DEVICE

CROSS-REFERENCE TO RELATED APPLICATION(S)

This application claims benefit of priority to Korean Patent Application No. 10-2021-0077289 filed on Jun. 15, 2021 in the Korean Intellectual Property Office, the disclosure of which is incorporated herein by reference in its entirety.

BACKGROUND

The present inventive concepts relate to a semiconductor device.

With growing demand for high performance, high speed, and/or multifunctionality in semiconductor devices, the demand for higher degrees of integration of such semiconductor devices has also increased. In manufacturing semiconductor devices having a fine pattern to correspond to the trend of high integration of the semiconductor devices, it is necessary to implement patterns having a fine width and/or a fine distance. In addition, in order to overcome the limitation of operating characteristics due to a size reduction of devices like field effect transistors (FET) and planar metal oxide semiconductor FETs (MOSFETs), efforts have been made to develop a semiconductor device including a FinFET having a channel having a three-dimensional structure.

SUMMARY

An aspect of the present inventive concepts is to provide a semiconductor device having improved electrical characteristics and reliability.

According to an aspect of the present inventive concepts, a semiconductor device includes: an active region extending in a first direction on a substrate; a gate structure extending in a second direction and intersecting the active region on the substrate, the gate structure comprising a gate electrode, a gate dielectric layer covering at least one surface of the gate electrode, spacer layers on both sides of the gate electrode, and a gate capping layer on the gate electrode; source/drain regions on the active region and on at least one side of the gate structure; a contact structure extending vertically on the substrate and connected to the source/drain regions, the contact structure comprising a barrier layer and a plug layer; and a contact via on the contact structure, wherein the contact structure includes a first portion connected to the source/drain regions and a second portion protruding upwardly between the first portion and the contact via, the barrier layer of the first portion covers a lower region of side surfaces of the plug layer of the first portion, the plug layer extends continuously from the first portion through the second portion such that the plug layer has a first height between a lower surface of the plug layer of the first portion and an upper surface of the plug layer of the second portion in a vertical direction, perpendicular to an upper surface of the substrate, the barrier layer has a second height between a lower surface of the barrier layer of the first portion and upper ends of the barrier layer, the upper ends of the barrier layer on both sides of the plug layer of the second portion facing each other in the first direction, such that the barrier layer of the second portion has both of the upper ends at a level lower than the upper surface of the plug layer of the second portion, and the second height is less than the first height.

According to an aspect of the present inventive concepts, a semiconductor device includes: an active region extending in a first direction on a substrate; gate structures extending in a second direction and intersecting the active region on the substrate; source/drain regions on the active region and on both sides of the gate structures; an interlayer insulating layer covering the source/drain regions and including a contact hole exposing one of the source/drain regions; a contact structure, in the contact hole, comprising a barrier layer and a plug layer, the contact structure includes a first portion filling a lower portion of the contact hole and a second portion protruding from a region of the first portion, the plug layer extends continuously from the first portion through the second portion, and the barrier layer of the second portion has upper ends recessed at a level lower than an upper surface of the plug layer of the second portion on both sides of the second portion of the plug layer facing each other in the first direction; and an insulating pattern in a portion of a remaining space of the contact hole excluding the contact structure.

According to an aspect of the present inventive concepts, a semiconductor device includes: an active region extending in a first direction on a substrate; a gate structure extending in a second direction and intersecting the active region, the gate structure comprising a gate electrode, spacer layers on both sides of the gate electrode, and a gate capping layer on the gate electrode; source/drain regions on the active region and on both sides of the gate structure; and contact structures connected to the source/drain regions and comprising a barrier layer and a plug layer, each of the contact structures including a first portion connected to the source/drain regions and a second portion protruding upwardly from a region of the first portion, the plug layer extends continuously from the first portion to the second portion, wherein the barrier layer of the second portion both upper ends recessed at a level lower than an upper surface of the plug layer of the second portion on both sides of the plug layer of the second portion and facing each other in the first direction, and a maximal height of the barrier layer between a bottom surface and an upper surface of the barrier layer is less than a maximal height of the plug layer between a bottom surface and an upper surface of the plug layer.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
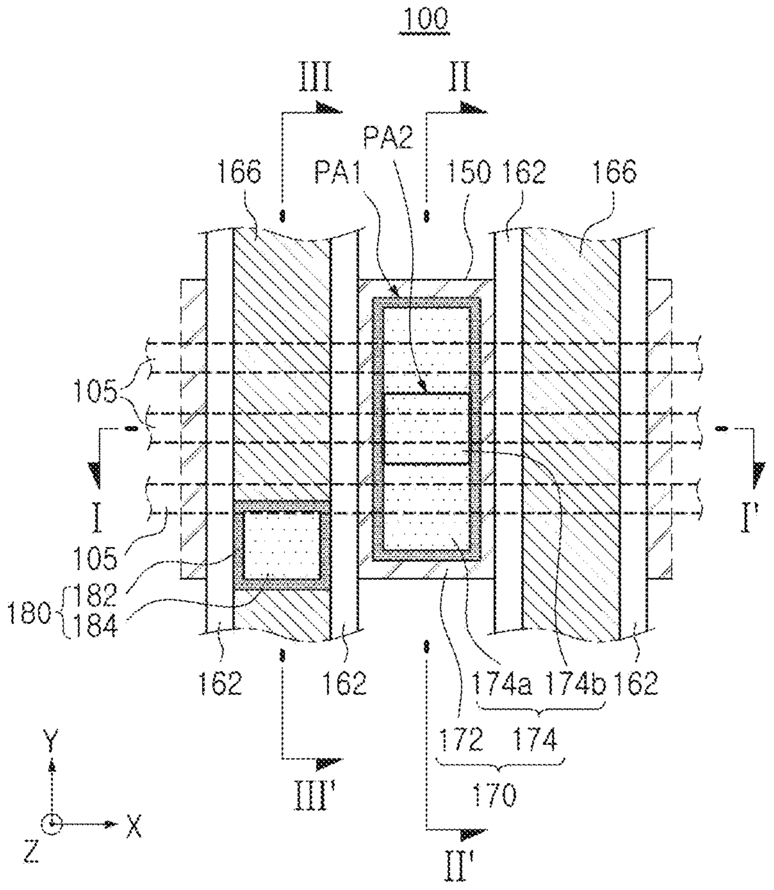
FIG. 1 is a schematic plan view of a semiconductor device according to some example embodiments.

Hereinafter, some example embodiments of the present inventive concepts will be described with reference to the accompanying drawings. The same reference numerals are used for the same components in the accompanying drawings, and repeated descriptions thereof are omitted. Spatially relative terms, such as "vertical," "down," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees, turned over, and/or at other orientations) and the spatially relative descriptors used herein interpreted accordingly.

FIG. 1 is a schematic plan view of a semiconductor device according to some example embodiments. In FIG. 1, only a layout of main components of a semiconductor device is illustrated.

Figure 2:
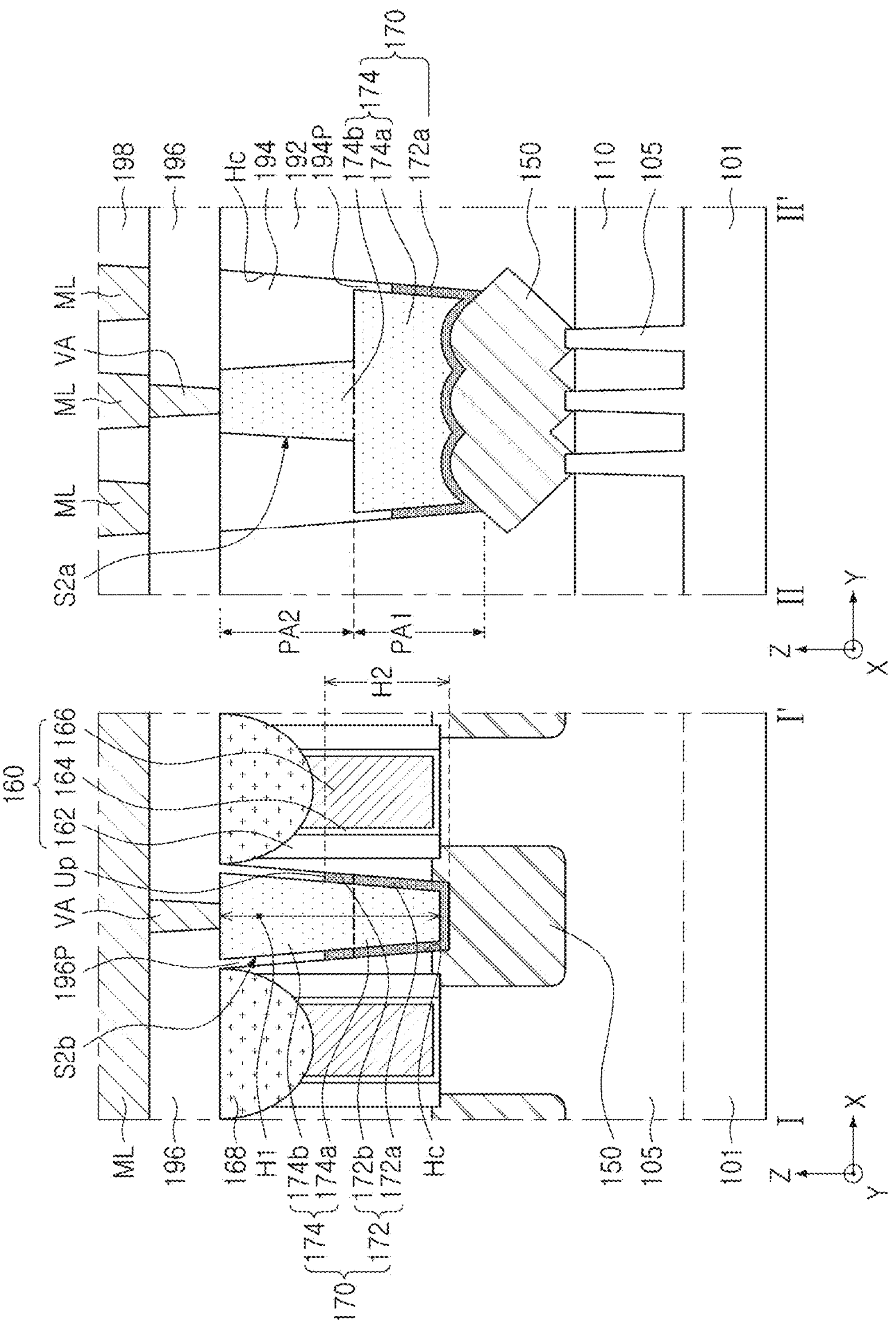
FIG. 2 is a schematic cross-sectional view of a semiconductor device according to some example embodiments.

FIG. 2 is a schematic cross-sectional view of a semiconductor device according to some example embodiments. FIG. 2 illustrates cross-sections of some example embodiments of the semiconductor device of FIG. 1, taken along lines I-I' and II-IP.

Figure 3:
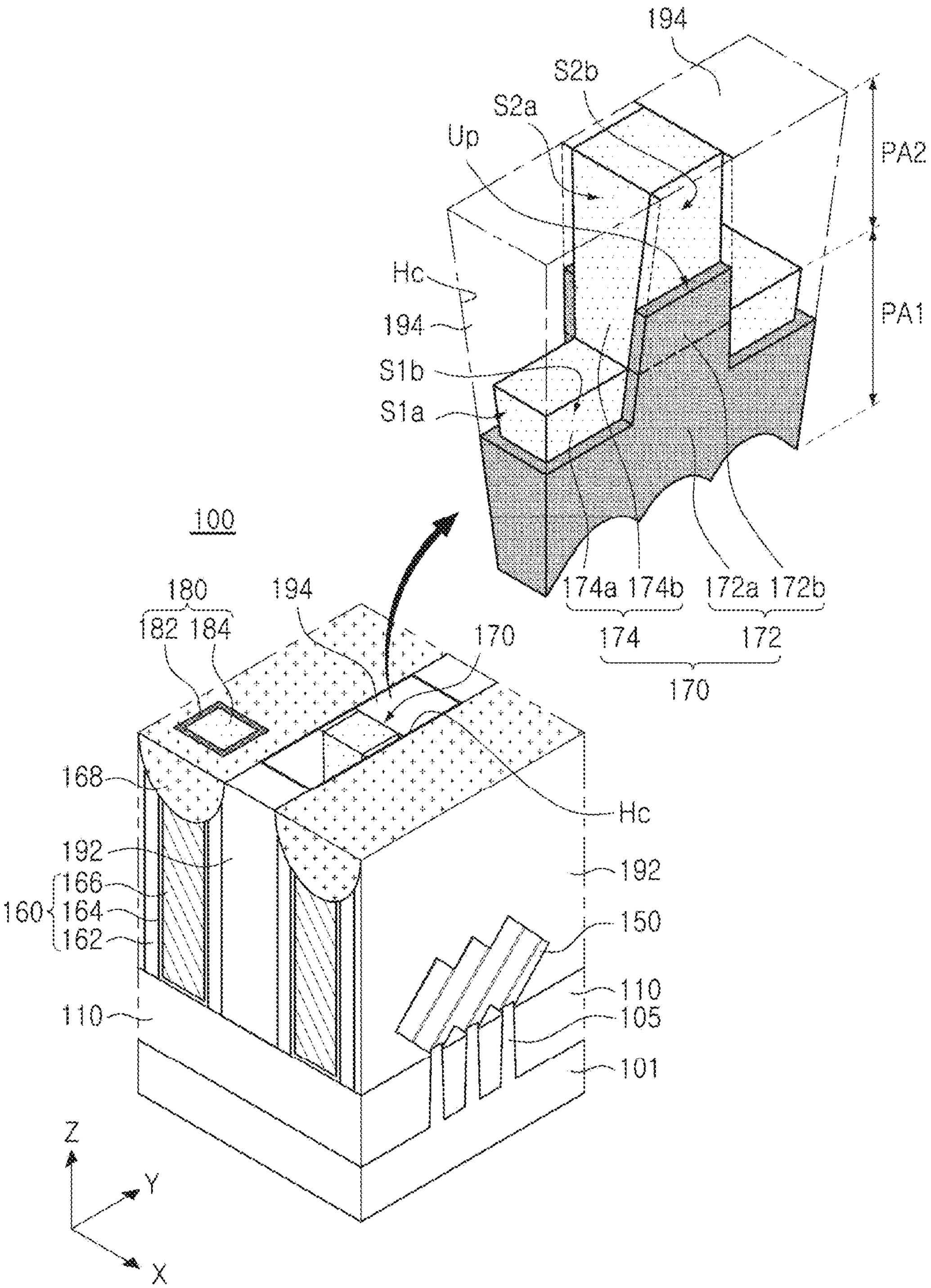
FIG. 3 is a schematic perspective view of a semiconductor device according to some example embodiments.

FIG. 3 is a schematic perspective view of a semiconductor device according to some example embodiments. In FIG. 3, an enlarged view of a contact structure of a semiconductor device is illustrated.

Figure 4:
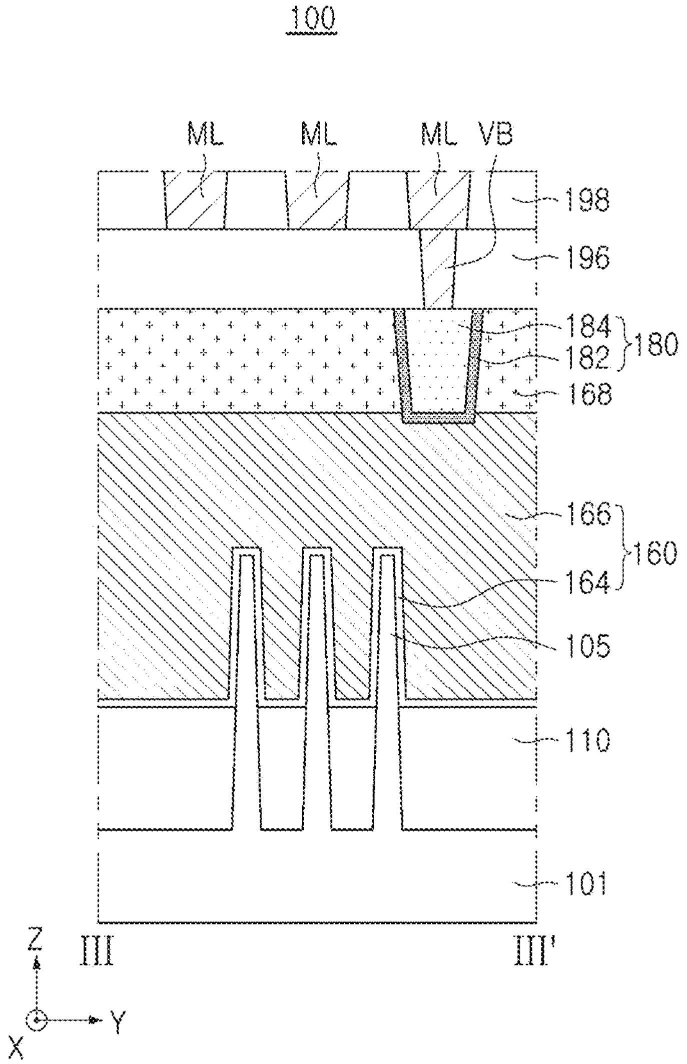
FIG. 4 is a schematic cross-sectional view of a semiconductor device according to some example embodiments.

FIG. 4 is a schematic cross-sectional view of a semiconductor device according to some example embodiments. FIG. 4 illustrates a cross-section of the semiconductor device of FIG. 1, taken along line III-III'.

Referring to FIGS. 1 to 4, the semiconductor device 100 may include a substrate 101, active regions 105 on the substrate 101, gate structures 160 extending to intersect the active regions 105, gate capping layers 168 on the gate structures 160, source/drain regions 150 disposed on active regions 105 on at least one side of gate structures 160, and a contact structure 170 connected to the source/drain regions 150. The semiconductor device 100 may further include an isolation insulating layer 110 between the active regions 105, a gate contact structure 180 connected to the gate structures 160, a first contact via VA connected to the contact structure 170, a second contact via VB connected to the gate contact structure 180, interconnection layers ML connected to the first and second contact vias VA and VB, an interlayer insulating layer 192 covering the source/drain regions 150 between the gate structures 160, an insulating pattern 194 in contact with the contact structure 170, and first and second upper insulating layers 196 and 198 on the interlayer insulating layer 192. The gate structure 160 may include spacer layers 162, a gate dielectric layer 164, and a gate electrode 166.

The semiconductor device 100 may include an active fin in which the active region 105 has a fin structure, and may include FinFET devices which are transistors in which a channel region is formed in the active region 105 intersecting the gate electrode 166.

The substrate 101 may have an upper surface extending in, e.g., an X-direction and a Y-direction). The substrate 101 may include a semiconductor material, e.g., a group IV semiconductor, a group III-V compound semiconductor, and/or a group II-VI compound semiconductor. For example, the group IV semiconductor may include at least one of silicon (Si), germanium (Ge), and/or silicon germanium (SiGe). The substrate 101 may be provided as a bulk wafer, an epitaxial layer, a silicon on insulator (SOI) layer, a semiconductor on insulator (SeOI) layer, and/or the like.

The active regions 105 may be defined by the isolation insulating layer 110 in the substrate 101 and may be disposed to extend in a first direction (e.g., the X-direction). A plurality of active regions 105 may be disposed to be spaced apart from each other in a second direction (e.g., the Y-direction). The active regions 105 may have a structure protruding from the substrate 101. Upper ends of the active regions 105 may be disposed to protrude to a predetermined (and/or otherwise desired) height from an upper surface of the isolation insulating layer 110. The active regions 105 may be formed as part of the substrate 101 and/or may include a layer (e.g. epitaxially) grown from (and/or otherwise disposed on to) the substrate 101. In some example embodiments, on both sides of the gate structure 160, the active regions 105 on the substrate 101 may be partially recessed, and the source/drain regions 150 may be disposed on the recessed active regions 105. Accordingly, as shown in FIG. 2, the active regions 105 may have a relatively high height under the gate structures 160. In some embodiments, the active regions 105 may include impurities (e.g., dopants), and at least some of the active regions 105 may include different conductivity types and/or concentrations of impurities, but is not limited thereto.

The isolation insulating layer 110 may define the active regions 105 in the substrate 101. The isolation insulating layer 110 may be formed by, e.g., a shallow trench isolation (STI) process. The isolation insulating layer 110 may expose upper side surfaces of the active regions 105. For example, the active regions 105 may partially protrude from an upper surface of the isolation insulating layer 110. In some example embodiments, the isolation insulating layer 110 may include a region extending deeper below the substrate 101 between the active regions 105. In some example embodiments, the isolation insulating layer 110 may have a curved upper surface, e.g., having a higher level toward the active regions 105 and/or a negative slope away from the active regions 105, but a shape of the upper surface of the isolation insulating layer 110 is not limited thereto. The isolation insulating layer 110 may be formed of an insulating material. The isolation insulating layer 110 may be, for example, at least one of silicon oxide, silicon nitride, and/or a combination thereof.

The source/drain regions 150 may be disposed on the recess regions in which the active regions 105 are recessed, for example, respectively, on both sides of the gate structures 160. The source/drain regions 150 may be provided as a source region and/or a drain region of a transistor. As shown in FIG. 2, an upper surface of the source/drain regions 150 may be positioned on a height level similar to (or higher) than a lower surface of the gate structures 160. However, relative heights of the source/drain regions 150 and the gate structures 160 may be variously modified according to the example embodiments. For example, the source/drain regions 150 may have an elevated source/drain shape in which the upper surface of the source/drain regions 150 is higher than the lower surface of the gate structures 160, but the example embodiments are not limited thereto.

As shown in FIG. 2, the source/drain regions 150 may have a hexagonal (and/or a similar shape) in cross-section in the Y-direction on both sides of the gate structures 160. However, in some example embodiments, the source/drain regions 150 may have various shapes, e.g., any one of a polygonal shape (e.g., a rectangular or pentagonal shape), a circular shape, an oval shape, and/or the like. In some example embodiments. the upper and/or lower surface of the source/drain regions 150 may not be flat. For example, the upper and/or lower surface of the source/drain regions 150 may include dips and/or peaks between surfaces from which the source/drain regions 150 were grown in cross-section in the Y-direction, as shown in FIG. 2. In addition, the source/drain regions 150 may have a generally flat upper surface in cross-section in the X-direction, as shown in FIG. 2, and/or may have a curved shape of a portion of a circle, an oval, and/or a similar shape. However, such a shape may be variously changed in the example embodiments according to, e.g., the distance between the adjacent gate structures 160 and the height of the active regions 105.

The source/drain regions 150 may be formed of a conductive and/or semiconductor material. For example, the source/drain regions 150 may include at least one of silicon germanium (SiGe), silicon (Si), silicon arsenic (SiAs), silicon phosphide (SiP), silicon carbide (SiC), and/or the like. In some example embodiment, the source/drain regions 150 may be formed of an epitaxial layer. For example, the source/drain regions 150 may include n-type doped silicon (Si) and/or p-type doped silicon germanium (SiGe). In some example embodiments, the source/drain regions 150 may include a plurality of regions including elements having different concentrations and/or doping elements. The source/drain regions 150 may be connected to and/or merged with each other on two or more active regions 105 disposed adjacent to each other to form one source/drain region 150, but the example embodiments are not limited thereto.

The gate structures 160 may be disposed on the active regions 105 to intersect the active regions 105 and extend in the second direction (e.g., the Y-direction). Channel regions of transistors may be formed in the active regions 105 intersecting the gate structures 160. In this disclosure, the term "channel region" may refer to a region including a depletion region of a transistor, and may refer to a partial region of the active region 105 intersecting the gate structure 160 and adjacent to the gate structure 160. For example, the channel region may be a region of the active region 105 below the gate structure 160 and between two adjacent source/drain regions 150.

The spacer layers 162 may be disposed on both sides of the gate electrode 166. The space layers 162 may include an insulating material. For example, the spacer layers 162 may insulate the source/drain regions 150 from the gate electrodes 166. The spacer layers 162 may have a multilayer structure according to some example embodiments. The spacer layers 162 may be formed of, e.g., silicon oxide, silicon nitride, silicon oxynitride, a low-k film, and/or the like.

The gate dielectric layer 164 may be disposed between the active region 105 and the gate electrodes 166. For example, the gate dielectric layer 164 may be disposed to cover at least one surface (e.g., a lower surface and both side surfaces), of the gate electrodes 166. The gate dielectric layer 164 may include an insulating material such as an oxide, a nitride, and/or a high-k material. The high-k material may refer to a dielectric material having a dielectric constant higher than that of a silicon oxide layer ($SiO_2$) The high-k material may be, for example, at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$), and/or the like.

The gate electrode 166 may include a conductive material, e.g., a metal nitride (such as titanium nitride (TiN), tantalum nitride (TaN), or tungsten nitride (WN), and/or the like) and/or a metal material (such as aluminum (Al), tungsten (W), titanium (Ti), ruthenium (Ru), or molybdenum (Mo), and/or the like), and/or a semiconductor material (such as doped polysilicon). In some example embodiments, the gate electrodes 166 may include two or more multilayers. Depending on a configuration of the semiconductor device 100, the gate electrode 166 may be disposed to be separated from each other in the Y-direction between at least some of the adjacent transistors.

The gate capping layers 168 may be disposed on the gate structures 160 and may be disposed in a form in which upper portions of the gate structures 160 are partially recessed and filled. Accordingly, the gate capping layers 168 may have a downwardly convex curved lower surface and a substantially flat upper surface. The upper surface of the gate capping layer 168 may have a width greater than that of the gate structure 160 in the first direction (e.g., the X-direction) and may have a maximal width filling a gap between adjacent contact structures 170. A portion of an upper side surface of the gate capping layer 168 may be exposed through a contact hole Hc. A lower surface of the gate capping layer 168 may be in contact with the spacer layers 162, the gate dielectric layer 164, the gate electrode 166, and the interlayer insulating layer 192. However, the example embodiments are not so limited, and in some example embodiments, the gate capping layers 168 may not extend beyond the outside of the spacer layers 162 but may be disposed to be limited to upper portions of the spacer layers 162 and/or may be disposed to be limited only between the spacer layers 162 so that both side surfaces of in the first direction (e.g., X-direction) are covered by the spacer layers 162.

The gate capping layers 168 may include an insulating material, such as at least one of SiO, SiN, SiCN, SiOC, SiON, SiOCN, and/or the like. In some example embodiments, the gate capping layers 168 may include a material different from that of the interlayer insulating layer 192. The gate capping layers 168 may self-align a contact hole Hc between the gate capping layers 168 when the contact hole Hc for forming the contact structure 170 is formed. The contact hole Hc may be formed in a region between the gate capping layers 167 to extend downwardly and to be stably connected to the source/drain regions 150.

The contact structure 170 may be connected to the source/drain regions 150 and apply an electrical signal to the source/drain regions 150. The contact structure 170 may be disposed in the contact hole Hc penetrating through the interlayer insulating layer 192 in a third direction (e.g., the Z-direction), for example, extending vertically from the top to the bottom. An upper surface of the source/drain region 150 may be exposed at a lower end of the contact hole Hc. The contact structure 170 may be disposed on the source/drain regions 150, and in some example embodiments, the contact structure 170 may extend outwardly to have a length greater than the source/drain regions 150 in the second direction (e.g., Y-direction). The contact structure 170 may have an inclined side surface in which a lower width (e.g., in the first direction) is narrower than an upper width (e.g., in the first direction) according to an aspect ratio, but the example embodiments not limited thereto.

The contact structure 170 may be partially recessed in an upper region of the source/drain regions 150 and may be disposed to be in contact with an upper surface of the source/drain region 150. For example, a lower surface of the contact structure 170 may have a curved shape along a curved upper surface of the source/drain regions 150. However, the example embodiments are not so limited, and the shape of the lower surface of the contact structure 170 may be variously changed according to some example embodiments. The contact structure 170 may include a barrier layer 172 and a plug layer 174. In some example embodiments, the contact structure 170 may further include a metal-semiconductor compound layer (not illustrated) disposed between the barrier layer 172 and the source/drain regions 150. The metal-semiconductor compound layer may include, for example, at least one of a metal silicide, a metal germanide, metal silicide-germanide, and/or the like.

The contact structure 170 may include a first portion PA1 and a second portion PA2 on the first portion PA1. The first portion PA1 may be disposed to fill a lower portion of the contact hole Hc and may be, e.g., directly connected to the source/drain regions 150. The second portion PA2 may protrude upwardly from a region of the first portion PA1, for example, in the third direction (e.g., the Z-direction), and may be connected to the first contact via VA. As illustrated in FIGS. 1 and 2, in some example embodiments, the second portion PA2 may be disposed on a central region of the first portion PAL The plug layer 174 may vertically and continuously extend from (e.g., an upper portion of) the first portion PA1 through the second portion PA2. The barrier layer 172 may vertically and continuously extend from the first portion PA1 to a partial region of the second portion PA2. In the drawings, for convenience of explanation, a boundary between the first portion PA1 and the second portion PA2 is indicated by the dotted line.

The barrier layer 172*a* of the first portion PA1 may cover a lower surface and lower regions of side surfaces S1*a* and S1*b* of the plug layer 174*a* of the first portion PA1. Upper regions of the side surfaces S1*a* and S1*b* of the plug layer 174*a* of the first portion PA1 may be exposed from the barrier layer 172*a* of the first portion PA1 (e.g., by not being covered by the barrier layer 172*a* of the first portion PA1). The upper surface of the plug layer 174*a* of the first portion PA1 may be positioned at a level lower than the upper surface of the gate electrode 166. The upper surface of the barrier layer 172*a* of the first portion PA1 exposed through the contact hole Hc may be positioned at a level lower than that of the upper surface of the plug layer 174*a* of the first portion PA1. The upper surface of the plug layer 174*a* of the first portion PA1 and upper regions of the side surfaces S1*a* and S1*b* of may not be covered by the barrier layer 172*a* of the first portion PA1. A width of the plug layer 174*a* of the first portion PA1 in the second direction (e.g., the Y-direction) may decrease toward the substrate 101. A maximal width of the plug layer 174*a* of the first portion PA1 in the second direction (e.g., the Y-direction) may be greater than a maximal width of the plug layer 174*b* of the second portion PA2 in the second direction (e.g., the Y-direction).

The barrier layer 172*b* of the second portion PA2 may have upper ends Up recessed in the contact hole Hc at a level lower than the upper surface of the plug layer 174*b*. The barrier layer 172*b* may have upper ends Up on both sides of the plug layer 174*b* of the second portion PA2, with both upper ends Up facing each other in the first direction (e.g., X-direction). The barrier layer 172*b* of the second portion PA2 may cover lower regions of the side surfaces S2*b* of the plug layer 174*b* of the second portion PA2 facing each other in the X-direction. The upper regions of the side surfaces S2*b* of the plug layer 174*b* of the second portion PA2 facing each other in the X-direction may be exposed from the barrier layer 174*b* of the second portion PA2. An upper surface of the plug layer 174*b* of the second portion PA2 may be positioned at a level higher than that of an upper surface of the plug layer 174*a* of the first portion PA1 and an upper surface of the gate electrode 166. An upper surface of the plug layer 174*b* of the second portion PA2 and upper regions of the side surfaces S2*b* facing each other in the X-direction may be not covered by the barrier layer 172*b* of the second portion PA2. A width of the plug layer 174*b* of the second portion PA2 in the second (e.g., the Y-direction) may increase toward the substrate 101. However, a width of the plug layer 174*b* of the second portion PA2 may decrease in the first direction (e.g., the X-direction) toward the substrate 101.

The plug layer 174 may have a first height H1 from the lower surface of the plug layer 174*a* of the first portion PA to the upper surface of the plug layer 174*b* of the second portion PA2 in the vertical direction (e.g., the Z-direction). The barrier layer 172 may have a second height H2 from the lower surface of the barrier layer 172*a* of the first portion PA1 to both upper ends Up of the barrier layer 172*b* of the second portion PA2 in the vertical direction (e.g., the Z-direction). The second height H2 may be less than the first height H1. The first height H1 may be a maximal height between the bottom surface of the plug layer 174 and the upper surface thereof and the second height H2 may be a maximal height between the bottom surface of the barrier layer 172 and the upper surface thereof.

The barrier layer 172 may include a metal nitride, e.g., at least one of titanium nitride (TiN), tantalum nitride (TaN), and/or tungsten nitride (WN). The plug layer 174 may include a conductive material, e.g., at least one of aluminum (Al), copper (Cu), tungsten (W), cobalt (Co), ruthenium (Ru), and/or molybdenum (Mo).

When the contact structure 170 is formed to be recessed from top to bottom to have the first portion PA1 and the second portion PA2 within the contact hole Hc, the second portion PA2 of the contact structure 170 is not disposed alongside the gate contact structure 180 in the X-direction, and thus, the contact structure 170 and the gate contact structure 180 may be stably and electrically separated from each other.

Although the gate contact structure 180 is disposed alongside the second portion PA2 of the contact structure 170 in the first direction (e.g., X-direction), since the barrier layer 172*b* of the second portion PA2 has the upper ends Up recessed at a level lower than that of the upper surface of the plug layer 174*b* of the second portion PA2, an electrical short with the gate structure 160 and the gate contact structure 180 may be mitigated and/or prevented and electrical isolation may be further secured.

In some example embodiments, in the case of forming a gate isolation pattern isolating the gate structure 160 in the second direction (e.g., the Y-direction), when a conductive material constituting the gate structure 160 is deposited, the conductive material may be formed to be partially higher around the gate isolation pattern. In this case, a distance between the contact structure 170 and the gate structure 160 may be shorter in a relatively wide upper region, but by recessing the barrier layer 172*b* of the second portion PA2, an electric short may be prevented (and/or mitigated) by securing the separation distance between the contact structure 170 and the gate structure 160.

By recessing the barrier layer 172 below the upper surface of the plug layer 174, a proportion of the barrier layer 172 having a relatively high resistance in the contact structure 170 may be reduced to lower the resistance of the structure 170.

The gate contact structure 180 may be connected to the gate structure 160 through the gate capping layer 168 in the Z-direction and apply an electrical signal to the gate electrode 166. The gate contact structure 180 may be disposed to recess the gate electrode 166 to a predetermined (and/or otherwise desired) depth, but is not limited thereto. The gate contact structure 180 may include a gate contact barrier layer 182 and a gate contact plug layer 184. The gate contact barrier layer 182 may surround a lower surface and/or side surfaces of the gate contact plug layer 184. The gate contact barrier layer 182 may include an insulating material such as a metal nitride, e.g., at least one of titanium nitride (TiN), tantalum nitride (TaN), and tungsten nitride (WN). The gate contact plug layer 184 may include a conductive material, e.g., at least one of aluminum (Al), copper (Cu), tungsten (W), cobalt (Co), ruthenium (Ru), or molybdenum (Mo). In some example embodiments, the gate contact structure 180 may have a form in which at least two contacts and/or layers are stacked.

The interlayer insulating layer 192 is disposed between the gate structures 160 and may cover the source/drain regions 150 and/or the isolation insulating layer 110. The contact hole Hc penetrating through the interlayer insulating layer 192 may be formed in the interlayer insulating layer 192. The contact hole Hc may extend downwardly from edges of the gate capping layers 168 in first direction (e.g., the X-direction), but is not limited thereto. For example, the contact hole Hc may be formed to not contact the edges of the gate capping layers 168. The contact hole Hc may have a rectangular shape longer in the second direction (e.g., the Y-direction) than in the first direction (e.g., the X-direction) in plan view and may have a line shape or a bar shape, but is not limited thereto. For example, the contact hole Hc may have a round end in the Y-direction in the plan view. The contact hole Hc may have one of a polygonal shape, a square shape, a circular shape, an elliptical shape, a rhomboid shape, and/or the like in the plan view. The interlayer insulating layer 192 may include an insulating layer, such as at least one of, for example, silicon oxide, silicon nitride, silicon oxynitride, silicon oxycarbide, and/or a low-k material.

The insulating pattern 194 may be disposed to fill a portion of a remaining space of the contact hole Hc except for the contact structure 170. The insulating pattern 194 may be disposed on the first portion PA1 of the contact structure 170. The insulating pattern 194 may cover at least one of an upper surface of the plug layer 174*a* of the first portion PA1 and both side surfaces S2*a* of the plug layer 174*b* of the second portion PA2 facing each other (e.g., in the Y-direction). The insulating pattern 194 may have an upper surface that is substantially coplanar with the upper surface of the plug layer 174*b* of the second portion PA2. The insulating pattern 194 may include a protrusion 194P extending from the upper surface of the plug layer 174*a* of the first portion PA1 downwardly along the side surfaces S1*a* and S1*b* of the plug layer 174*a* of the first portion PA1 and contacting the upper surface of the barrier layer 172*a* of the first portion PAL The insulating pattern 194 may include an insulating material such as at least one of, for example, silicon oxide, silicon nitride, silicon oxynitride, silicon oxycarbide, and/or a low-k material.

The upper insulating layers 196 and 198 may be disposed on the interlayer insulating layer 192. The upper insulating layers 196 and 198 may include a first upper insulating layer 196 and a second upper insulating layer 198. The first upper insulating layer 196 may cover the gate capping layers 168, the upper surface of the plug layer 174*b* of the second portion PA2, and the upper surface of the insulating pattern 194. The first upper insulating layer 196 may include a protrusion 196P extending from the upper surface of the plug layer 174*b* of the second portion PA2 downwardly along both side surfaces S2*b* of the plug layer 174B of the second portion PA2 in the X-direction. The protrusion 196P of the first upper insulating layer 196 may extend into the contact hole Hc between the gate capping layer 168 and the plug layer 174*b* of the second portion PA2. The protrusion 196P of the first upper insulating layer 196 may contact both upper ends portions Up of the barrier layer 172*b* extending to the second portion PA2. The second upper insulating layer 198 may be disposed on the first upper insulating layer 196 and may be disposed between the interconnection layers ML. The upper insulating layers 196 and/or 198 may include an insulating material such as at least one of, for example, silicon oxide, silicon nitride, silicon oxynitride, silicon oxycarbide, and/or a low-k material.

The first contact via VA may be disposed on the contact structure 170. The first contact via VA may penetrate through the first upper insulating layer 196 in the Z-direction. The first contact via VA may be connected to the plug layer 174*b* of the second portion PA2. The second contact via VB may be disposed on the gate contact structure 180. The second contact via VB may penetrate through the first upper insulating layer 196 in the Z-direction. The second contact via VB may be connected to the gate contact structure 180. The contact vias VA and VB may include a conductive material such as a metal nitride (for example, at least one of titanium nitride (TiN), tantalum nitride (TaN), and tungsten nitride (WN)), and/or a metal material (for example, at least one of aluminum (Al), copper (Cu), tungsten (W), cobalt (Co), ruthenium (Ru), or molybdenum (Mo)). However, in some example embodiments, the contact vias VA and VB may be omitted, and/or each of the contact vias may have the form of a plurality of stacked vias.

The interconnection layers ML may be disposed on the contact structure 170 and the gate contact structure 180 and may extend in the X-direction. The interconnection layers ML may be connected to each of the first contact via VA and the second contact via VB. The interconnection layers ML may include a conductive material such as a metal nitride (for example) at least one of titanium nitride (TiN), tantalum nitride (TaN), and tungsten nitride (WN), and/or a metal material (for example, at least one of aluminum (Al), copper (Cu), tungsten (W), cobalt (Co), ruthenium (Ru), and molybdenum (Mo)).

Figure 5:
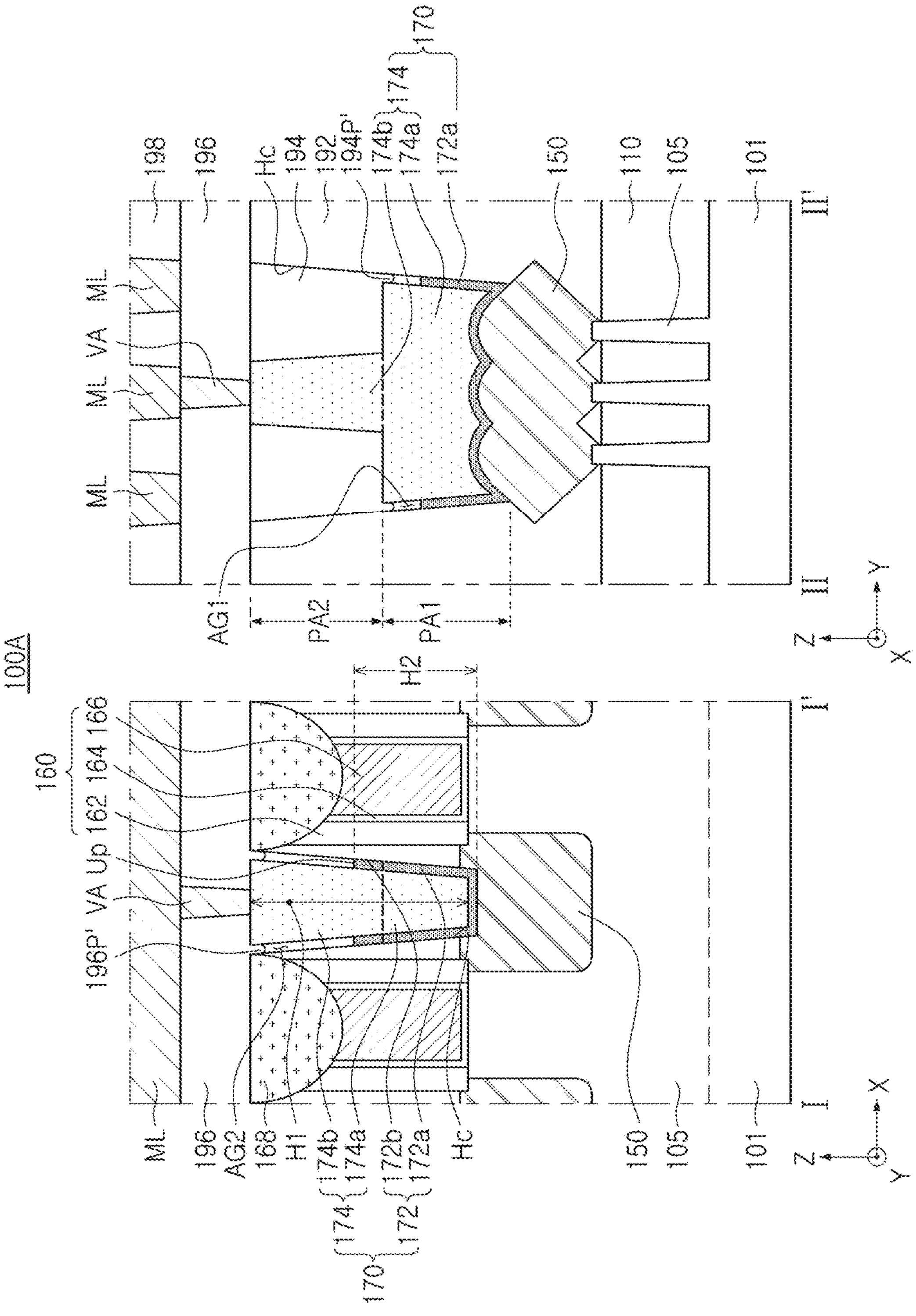
FIG. 5 is a schematic cross-sectional view of a semiconductor device according to some example embodiments.

FIG. 5 is a schematic cross-sectional view of a semiconductor device according to some example embodiments. FIG. 5 illustrates a region corresponding to FIG. 2.

Referring to FIG. 5, a semiconductor device 100A may further include air gaps AG1 and AG2 that are empty spaces. The first air gap AG1 may be disposed between the first portion PA1 of the contact structure 170 and the gate structure 160, and the second air gap AG2 may be disposed between the second portion PA2 of the contact structure 170 and the gate structure 160.

The first air gap AG1 may be disposed on an upper surface of the barrier layer 172*a* of the first portion PA1 in the contact hole Hc. The first air gap AG1 may be capped by a protrusion 194P' of the insulating pattern 194 at an upper portion thereof. Referring to FIG. 3, the first air gap AG1 may be formed to be defined by side surfaces S1*a* and S1*b* of the plug layer 174*a* of the first portion PAL The first air gap AG1 may be limited to an empty space surrounded by the barrier layer 172*a* of the first portion PA1, the plug layer 174*a* of the first portion PA1, and the protrusion 194P' of the insulating pattern 194.

The second air gap AG2 may be disposed on upper ends Up of the barrier layer 174*b* of the second portion PA2 in the contact hole Hc. The second air gap AG2 may be capped by the protrusion 196P' of the first upper insulating layer 196 at an upper portion thereof. Referring to FIG. 3 together, the second air gap AG2 may be formed on both side surfaces S2*b* of the plug layer 174*b* of the second portion (e.g., facing each other in the X-direction on an upper surface of the barrier layer 172*b* of the second portion PA2). The second air gap AG2 may be defined by an empty space surrounded by the barrier layer 172*b* of the second portion PA2, the plug layer 174*b* of the second portion PA2, the interlayer insulating layer 192, the insulating pattern 194, and the protrusion 196P' of the first upper insulating layer 196.

Parasitic capacitance between the contact structure 170 and the gate structure 160 may be reduced by the first and second air gaps AG1 and AG2. In addition, the contact structure 170 and the gate structure 160 may be more stably electrically separated from each other by the first and second air gaps AG1 and AG2. In some example embodiments, the semiconductor device 100A may include only one of the first and second air gaps AG1 and AG2.

Figure 6:
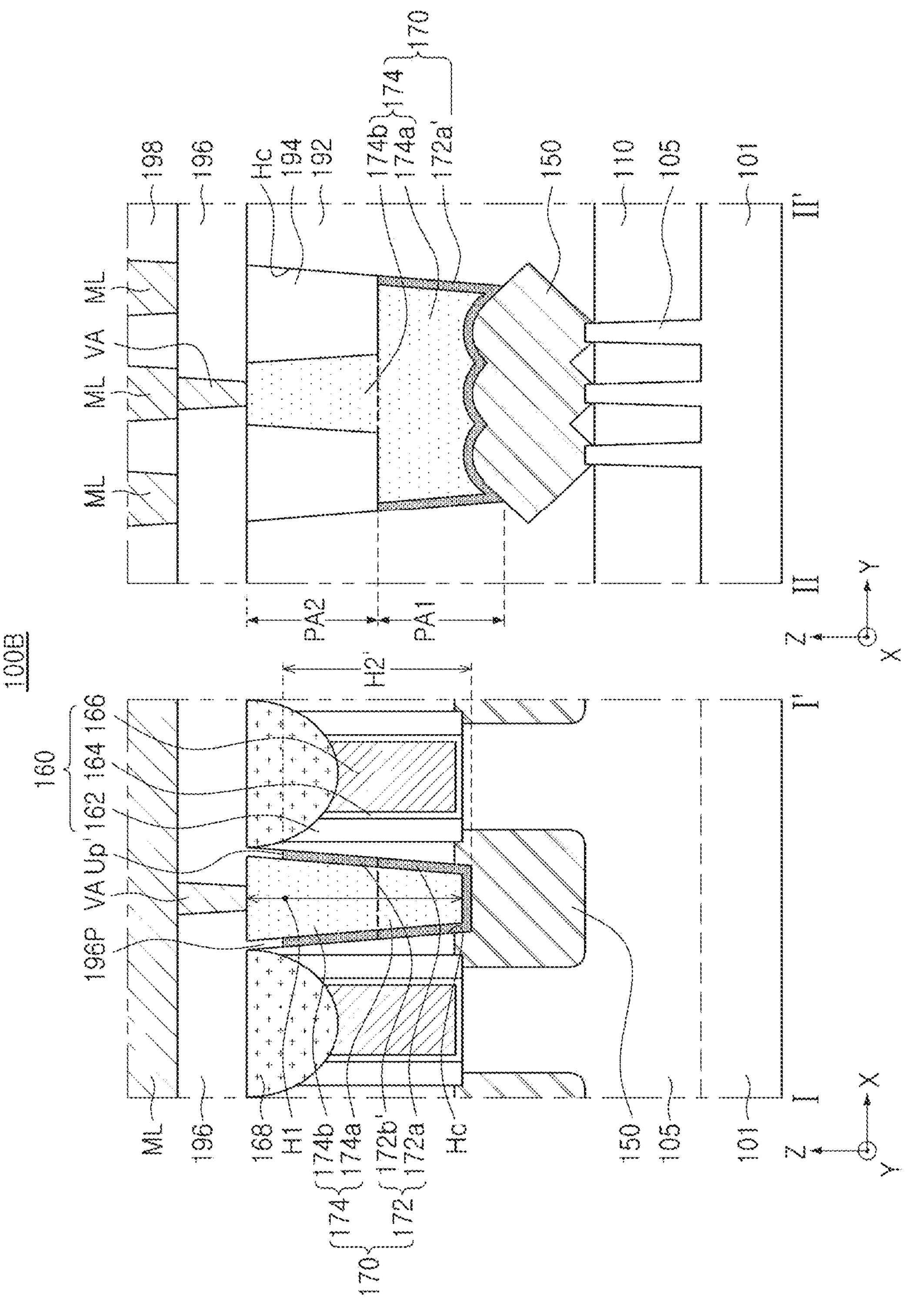
FIG. 6 is a schematic cross-sectional view of a semiconductor device according to some example embodiments.

FIG. 6 is a schematic cross-sectional view of a semiconductor device according to some example embodiments. FIG. 6 illustrates a region corresponding to FIG. 5.

Referring to FIG. 6, in a semiconductor device 100B, an upper surface of a barrier layer 172*a*' of the first portion PA1 may be positioned on substantially the same level as that of an upper surface of the plug layer 174*a* of the first portion PAL Both upper ends Up' of the barrier layer 172*b*' of the second portion PA2 may be positioned to be relatively higher than those in the previous example embodiments. For example, both upper ends Up' of the barrier layer 172*b*' of the second portion PA2 may be positioned at a level higher than that of an upper surface of the gate electrode 166. The barrier layer 172 may have a second height H2' between a lower surface of the barrier layer 172*a* of the first portion PA1 and an upper surface of the barrier layer 172*b*' of the second portion PA2. Also, the second height H2' may be lower than a first height H1. However, a recess depth may vary according to some example embodiments under the condition that the recessed upper ends Up' of the barrier layer 172 are formed at a level lower than that of the upper surface of the plug layer 174*b* of the second portion PA2.

Figure 7:
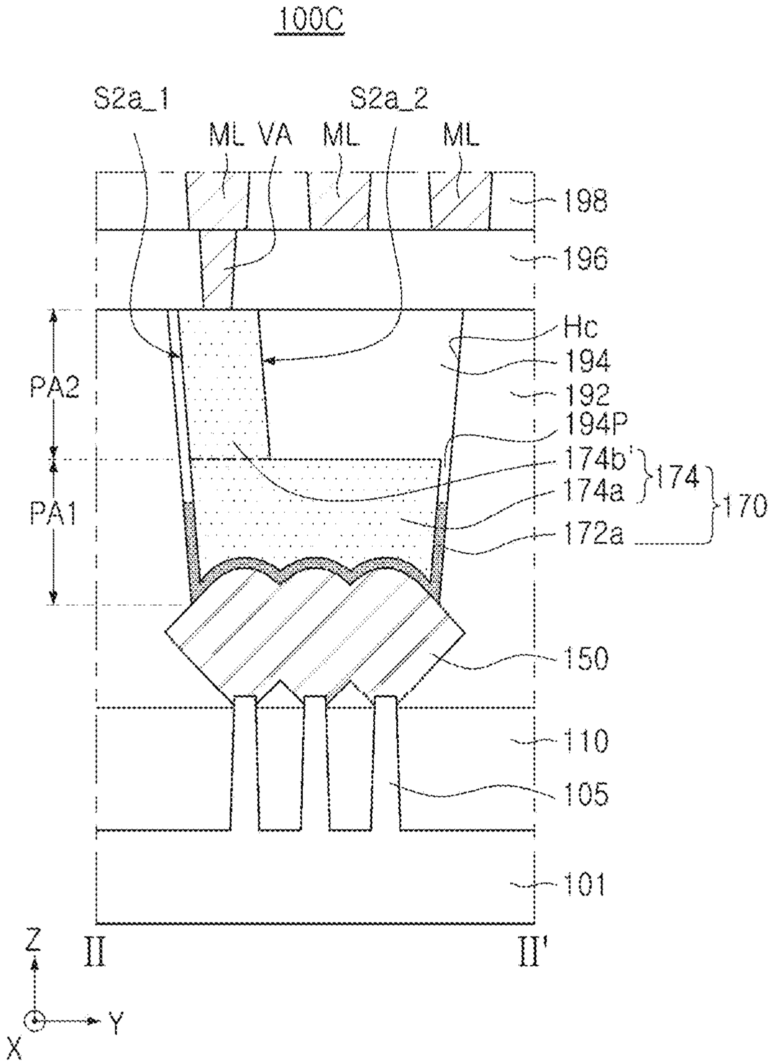
FIG. 7 is a schematic cross-sectional view of a semiconductor device according to some example embodiments.

FIG. 7 is a schematic cross-sectional view of a semiconductor device according to some example embodiments. FIG. 7 illustrates a region corresponding to a cross-section taken along line II-II' in FIG. 1.

Referring to FIG. 7, in a semiconductor device 100C, a plug layer 174*b*' of the second portion PA2 may be disposed at one end and/or edge of the first portion PA1 in the second direction (e.g., the Y-direction). For example, the second portion PA2 may be positioned at one end of the contact structure 170 in the Y-direction. The plug layer 174*b*' of the second portion PA2 may have a first side surface S2*a*_1 and a second side surface S2*a*_2 opposite to each other in the second direction (e.g., the Y-direction). The first side surface S2*a*_1 of the plug layer 174*b*' of the second portion PA2 may form a continuous surface with the side surface of the plug layer 174*a* of the first portion PAL The first side surface S2*a*_1 and the second side surface S2*a*_2 may have substantially the same inclination. A distance between the plug layer 174*b*' of the second portion PA2 and the gate contact structure 180 may increase (e.g., in plan view). The relative positions of the plug layer 174*b*' of the second portion PA2 and the first portion PA1 may vary according to some example embodiments and, for example, may be freely changed according to a layout design of the semiconductor device.

Figure 8:
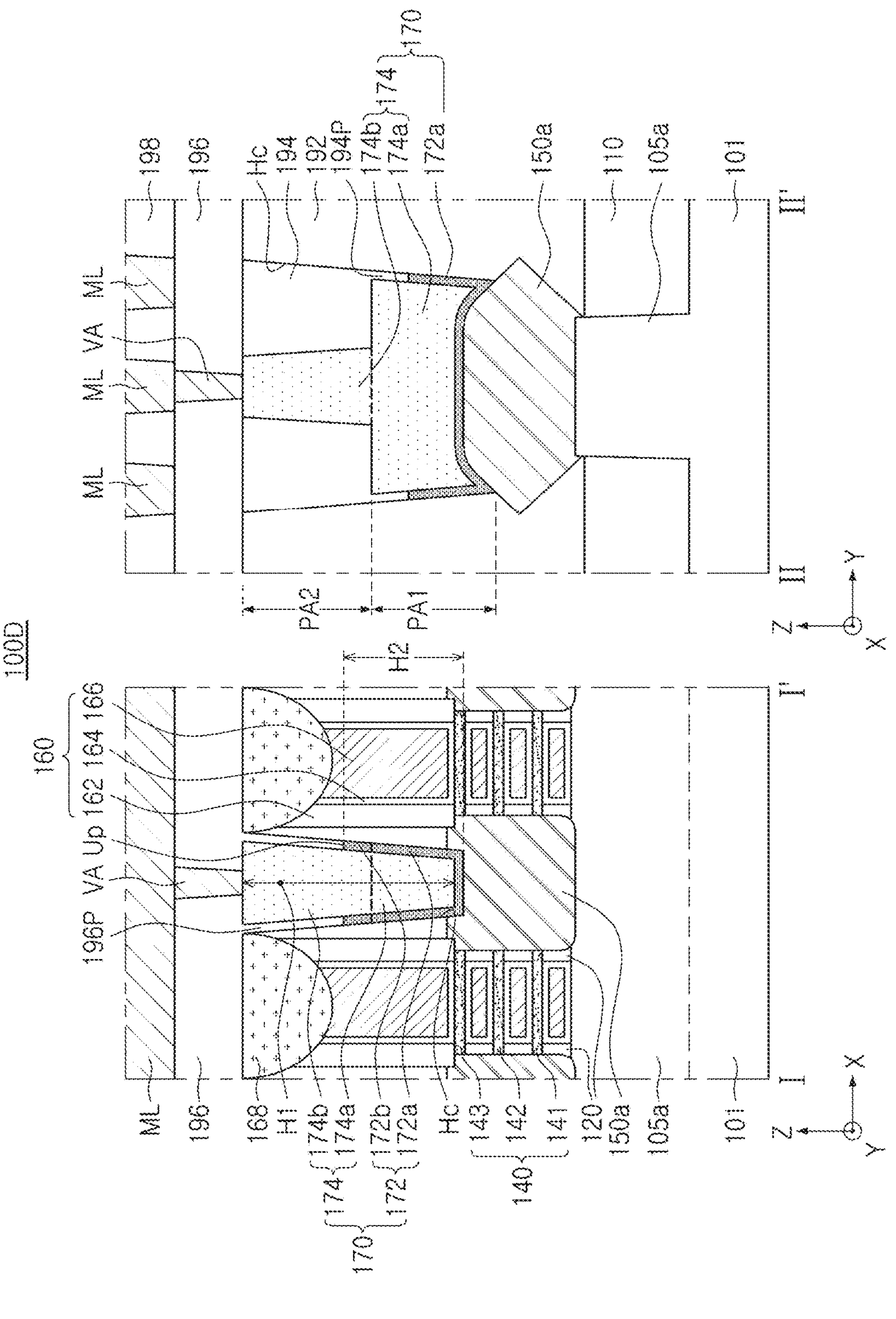
FIGS. 8 and 9 are schematic cross-sectional views of semiconductor devices according to some example embodiments.
Figure 9:
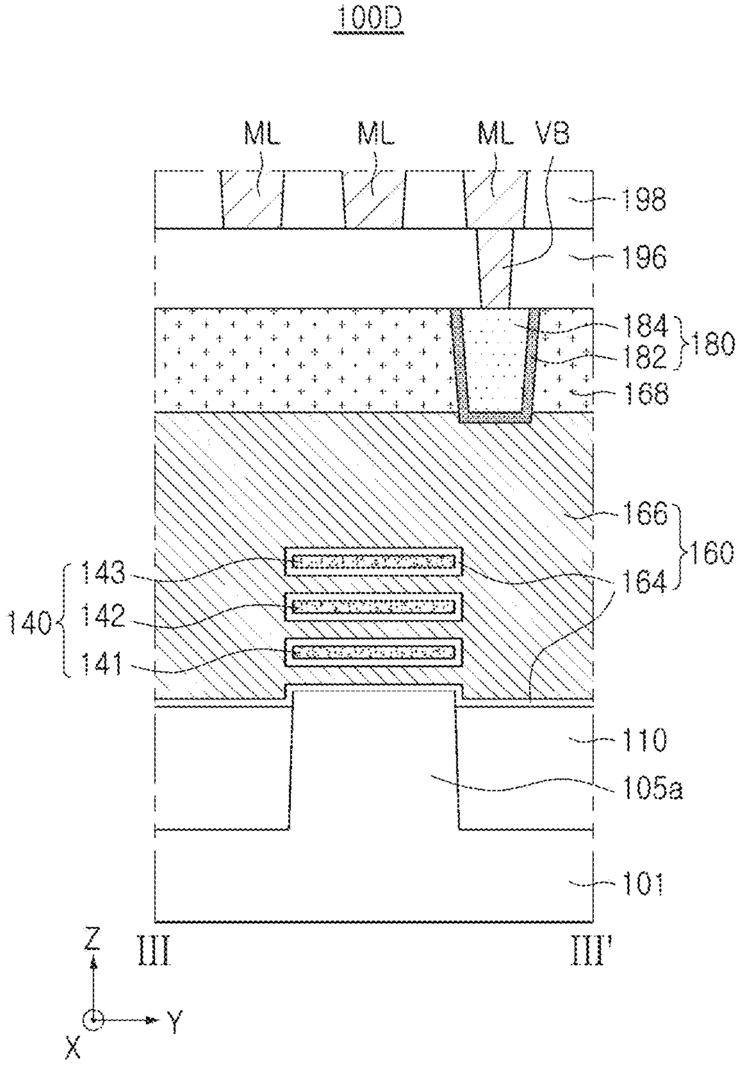

FIGS. 8 and 9 are schematic cross-sectional views of semiconductor devices according to some example embodiments.

Referring to FIGS. 8 and 9, an active region of a semiconductor device 100D may include an active fin 105*a* extending in the X-direction and channel structures 140 on the active fin 105*a*. The semiconductor device 100D may further include internal spacer layers 120 disposed between the gate structures 160 and the source/drain regions 150*a*. The source/drain region 150*a* may be formed on one active fin 105*a* and may be connected to the channel structures 140. The semiconductor device 100D may include FET such as multi-bridge channel FET (MBCFET™) devices in which the active fin 105*a* has a fin structure and the gate dielectric layer 164 and the gate electrode 166 are disposed to surround the channel structures 140 between the source/drain regions 150*a*.

The channel structure 140 may include two or more channel layers (e.g., first to third channel layers 141, 142, and 143) disposed to be spaced apart from each other in a direction (e.g., the vertical and/or Z-direction) perpendicular to an upper surface of the active fin 105*a*, on the active fin 105*a*. The two or more channel layers (e.g., first to third channel layers 141, 142, and 143) may be connected to the source/drain region 150*a* and spaced apart from an upper surface of the active fin 105*a*. The first to third channel layers 141, 142, and 143 may have a width which is the same as and/or similar to that of the active fin 105*a* in the Y-direction and may have a width which is the same as or similar to that of the gate structure 160 in the first direction (e.g., X-direction). However, in some example embodiments, the two or more channel layers (e.g., first to third channel layers 141, 142, and 143) may have a reduced width such that side surfaces thereof are positioned below the gate structure 160 in the first direction (e.g., X-direction). The two or more channel layers (e.g., first to third channel layers 141, 142, and 143) may be formed of a semiconductor material, and include, for example, at least one of silicon (Si), silicon germanium (SiGe), and/or germanium (Ge). The first to third channel layers 141, 142, and 143 may be formed of the same material as the substrate 101, for example. The number and shape of the channel layers 141, 142, and 143 constituting one channel structure 140 may be variously changed in some example embodiments.

The internal spacer layers 120 may be disposed alongside the gate electrode 166 between the channel structures 140. Below the third channel layer 143, the gate electrode 166 may be spaced apart from the source/drain regions 150*a* by the internal spacer layers 120 so as to be electrically isolated. The internal spacer layers 120 may have a shape in which a side surface facing the gate electrode 166 is convexly rounded inwardly toward the gate electrode 166, but the example embodiments are not limited thereto. The internal spacer layers 120 may be formed of silicon oxide, silicon nitride, silicon oxynitride, and/or a low-k film. In some example embodiments, the internal spacer layers 120 may be omitted, and in this case, the gate dielectric layer 164 and the gate electrode 166 may be disposed to extend in the first direction (e.g., X-direction).

In the above, FinFET and MBCFET™ devices are illustrated as examples of semiconductor devices according to some embodiments of the present inventive concepts, but the example embodiments are not limited thereto. The semiconductor device according to some embodiments of the present inventive concept may include a tunneling FET, a vertical FET, and/or a three-dimensional (3D) transistor.

FIGS. 10A to 18 are views illustrating a process sequence of a method of manufacturing a semiconductor device according to some example embodiments. FIGS. 10A to 18 illustrate an example of a manufacturing method for manufacturing the semiconductor device of FIGS. 1 to 4 and illustrate cross-sections taken along lines I-I', II-II', and III-III' in FIG. 1 and a perspective view corresponding to FIG. 3.

Figure 10A:
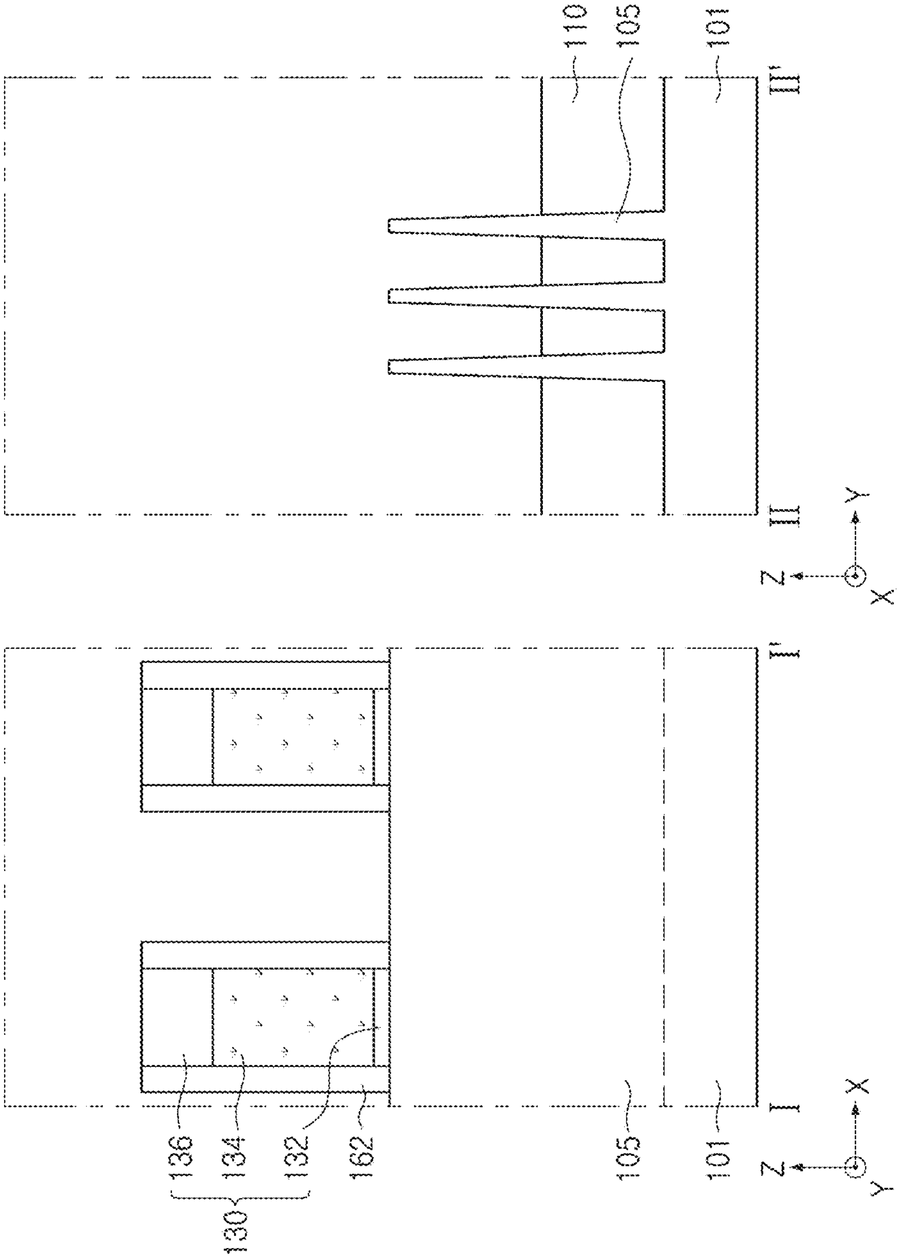
FIGS. 10A to 18 are views illustrating a process sequence of a method of manufacturing a semiconductor device according to some example embodiments.
Figure 10B:
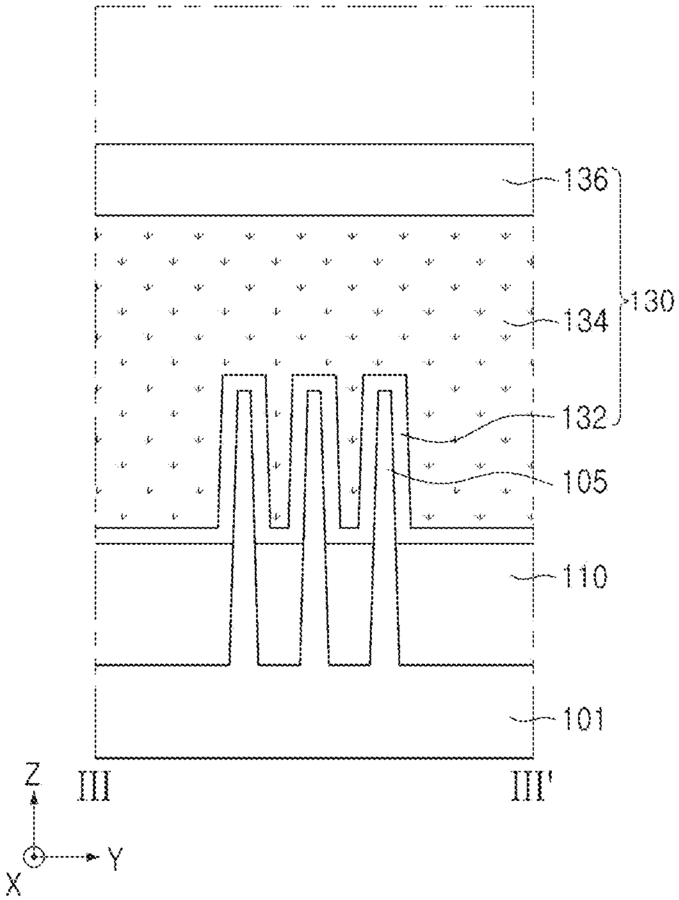

Referring to FIGS. 10A and 10B, the substrate 101 may be patterned to define an active region 105 including active fins; an isolation insulating layer 110 may be formed; and the sacrificial gate structures and spacer layers 162 may then be formed.

First, the active regions 105 may be formed by forming trenches (e.g., by anisotropically etching the substrate 101 using a mask layer). Since the trench regions have a high aspect ratio, a width thereof may become narrower downwardly, and accordingly, the active regions 105 may have a shape narrower upwardly. The isolation insulating layer 110 may be formed by filling the trench regions with an insulating material and then planarizing the upper surfaces of the active regions 105. In the case of the semiconductor device 100D of FIGS. 8 and 9, in this operation, the first to third channel layers 141, 142, and 143 of the channel structures 140 constituting the active region may be stacked on active fins alternately with sacrificial layers.

Next, the sacrificial gate structures 130 may be formed on the active regions 105 to have a line shape that crosses the active regions 105 and extends in the Y-direction. The sacrificial gate structures 130 may be formed in a region in which the gate dielectric layer 164 and the gate electrode 166 are disposed as shown in FIG. 2 through a subsequent process. The sacrificial gate structure 130 may include, e.g., first and second sacrificial gate layers 132 and 134 and a gate mask pattern layer 136. The first and second sacrificial gate layers 132 and 134 may be patterned using the gate mask pattern layer 136.

The first and second sacrificial gate layers 132 and 134 may be an insulating layer and a conductive layer, respectively, but are not limited thereto, and the first and second sacrificial gate layers 132 and 134 may be formed as a single layer. For example, the first sacrificial gate layer 132 may include silicon oxide, and the second sacrificial gate layer 134 may include polysilicon. The gate mask pattern layer 136 may include silicon oxide and/or silicon nitride. However, the structure of the sacrificial gate structure 130 may be variously changed in embodiments.

Next, spacer layers 162 may be formed on side surfaces of the sacrificial gate structures 130. The spacer layers 162 may include at least one of SiO, SiN, SiCN, SiOC, SiON, and/or SiOCN.

Figure 11:
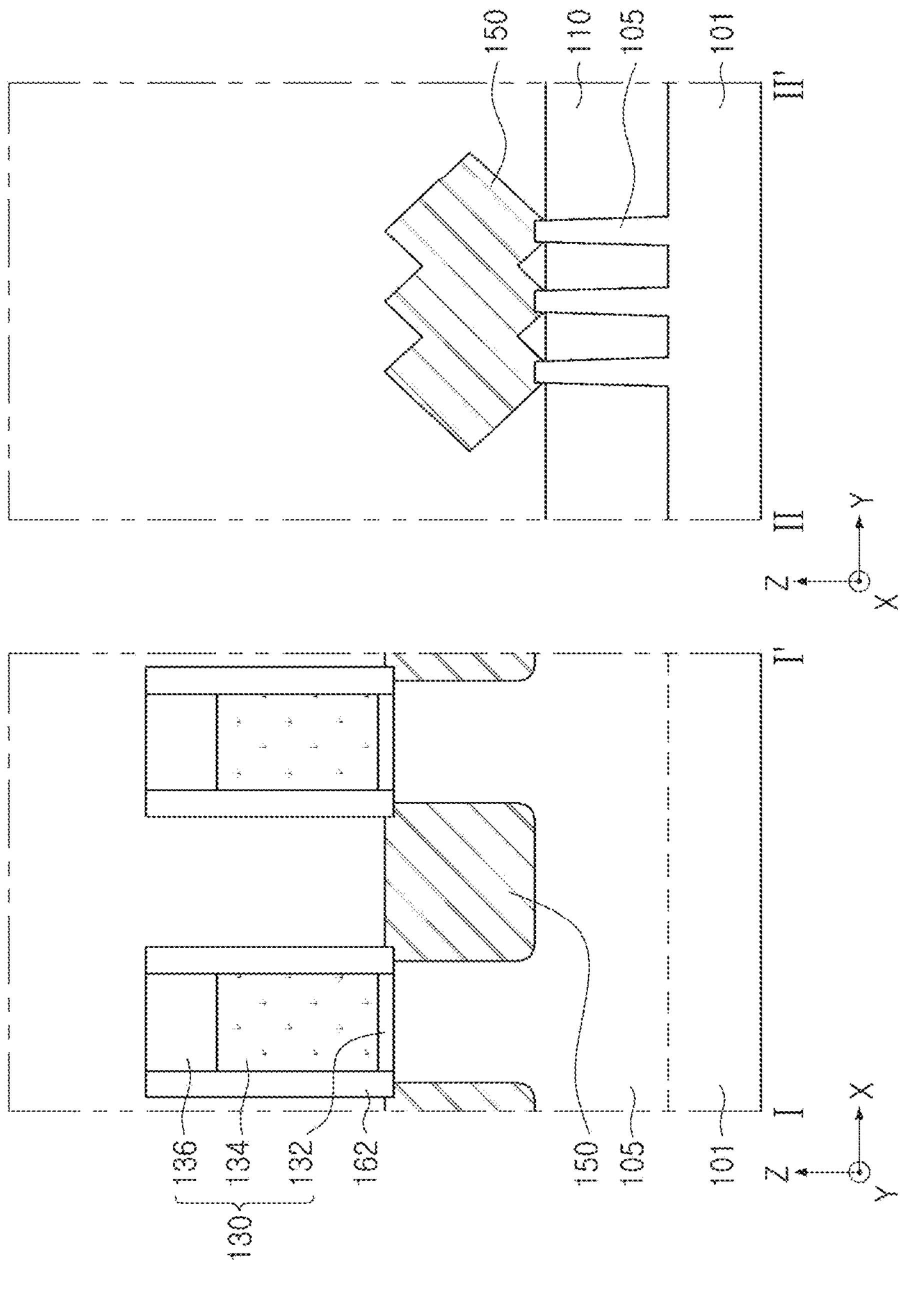

Referring to FIG. 11, the active regions 105 exposed between the sacrificial gate structures 130 may be recessed, and source/drain regions 150 may be formed.

First, the active regions 105 may be recessed from an upper surface to a predetermined (and/or otherwise desired) depth to form a recess region. The recess region may be formed by sequentially applying a dry etching process and a wet etching process, for example. Accordingly, in this operation, the active regions 105 may have a lower height at the outside of the sacrificial gate structures 130 than below the sacrificial gate structures 130. The recess region may extend to below the spacer layers 162 or to below the sacrificial gate structures 130, but is not limited thereto. Selectively, after the recess process, a process of curing the surfaces of the recessed active regions 105 may be performed through a separate process.

Next, the source/drain regions 150 may be grown from the active regions 105 using a selective epitaxial growth (SEG) process, for example. The source/drain regions 150 may include impurities by in-situ doping.

Figure 12A:
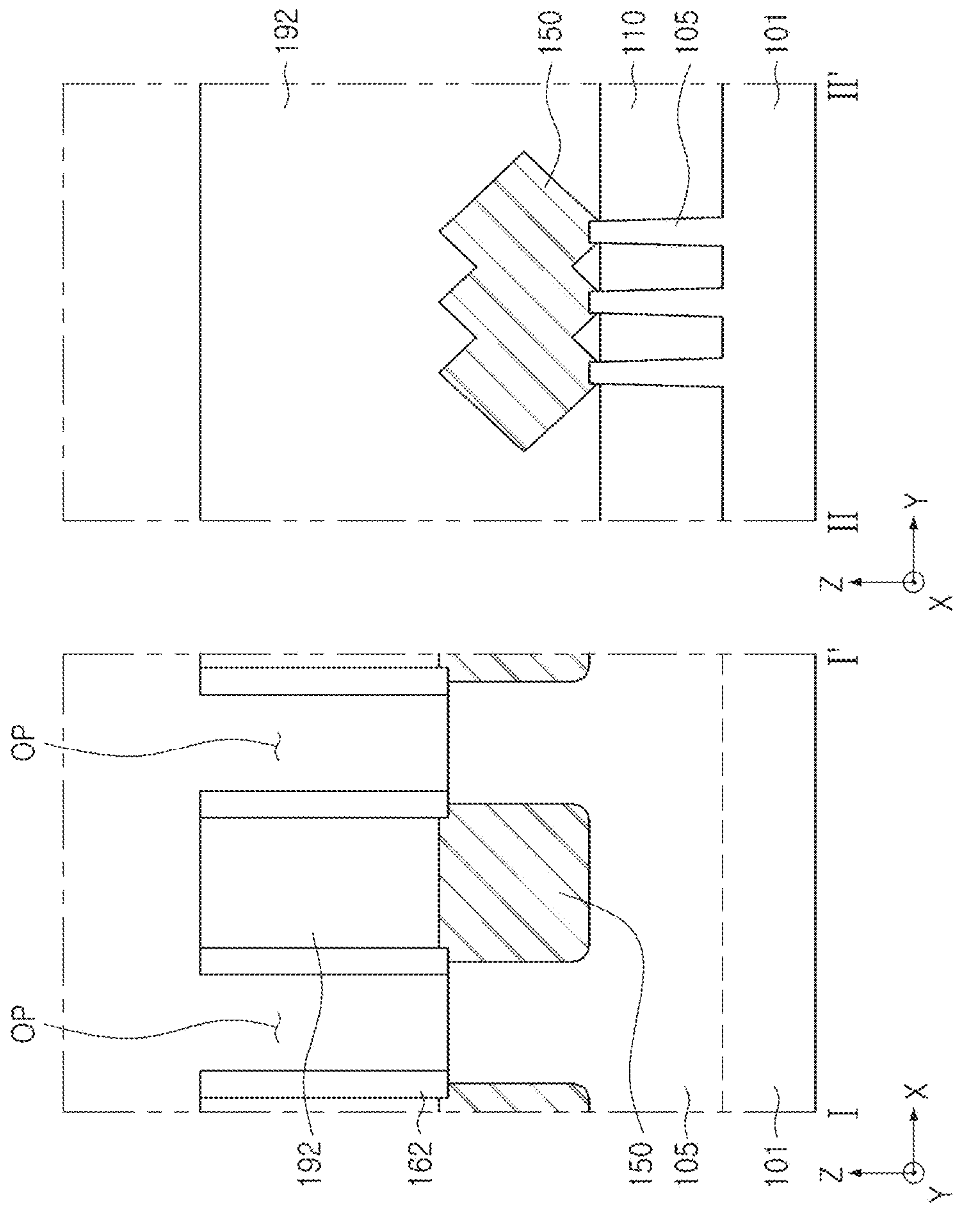
Figure 12B:
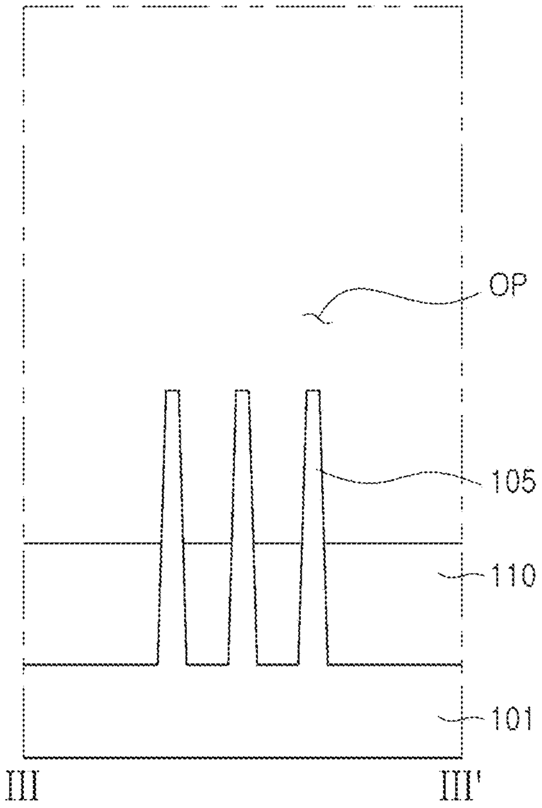

Referring to FIGS. 12A and 12B, after an interlayer insulating layer 192 is formed on the source/drain regions 150, the sacrificial gate structures 130 may be removed to form openings OP.

First, the interlayer insulating layer 192 may be formed by depositing an insulating material to cover the source/drain regions 150, the sacrificial gate structures 130, and the spacer layers 162, and then performing a planarization process so that upper surfaces of the second sacrificial gate layers 134 or the gate mask patterns 136 are exposed. In some example embodiments, the gate mask pattern layer 136 may be removed during the planarization process. The interlayer insulating layer 192 may include, for example, at least one of silicon oxide, silicon nitride, and/or silicon oxynitride, and/or may include a low-k material.

Next, the sacrificial gate structures 130 may be selectively removed with respect to the lower active regions 105 and the isolation insulating layer 110 to form openings OP. As the removal process of the sacrificial gate structures 130, at least one of a dry etching process and/or a wet etching process may be used.

Figure 13A:
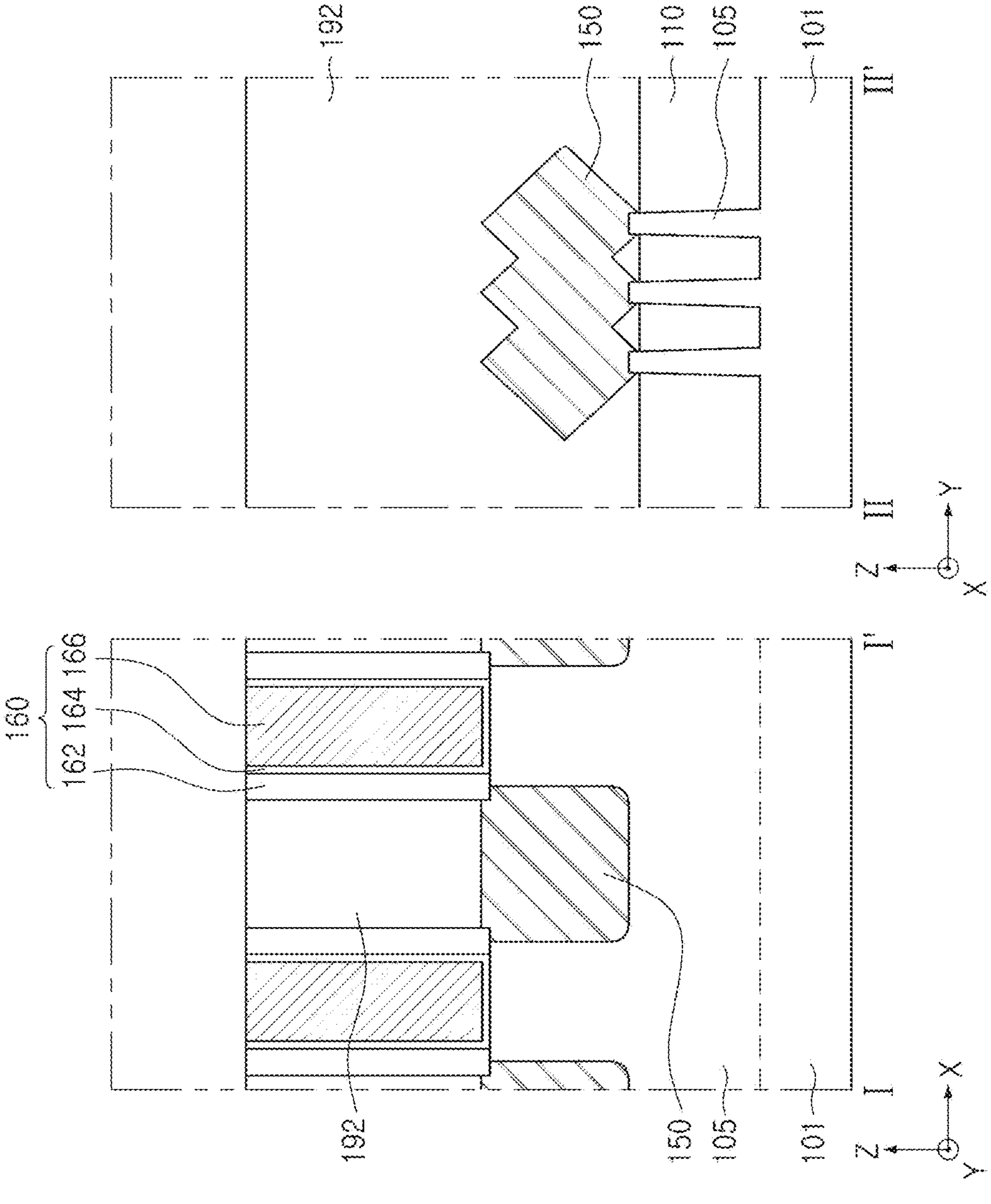
Figure 13B:
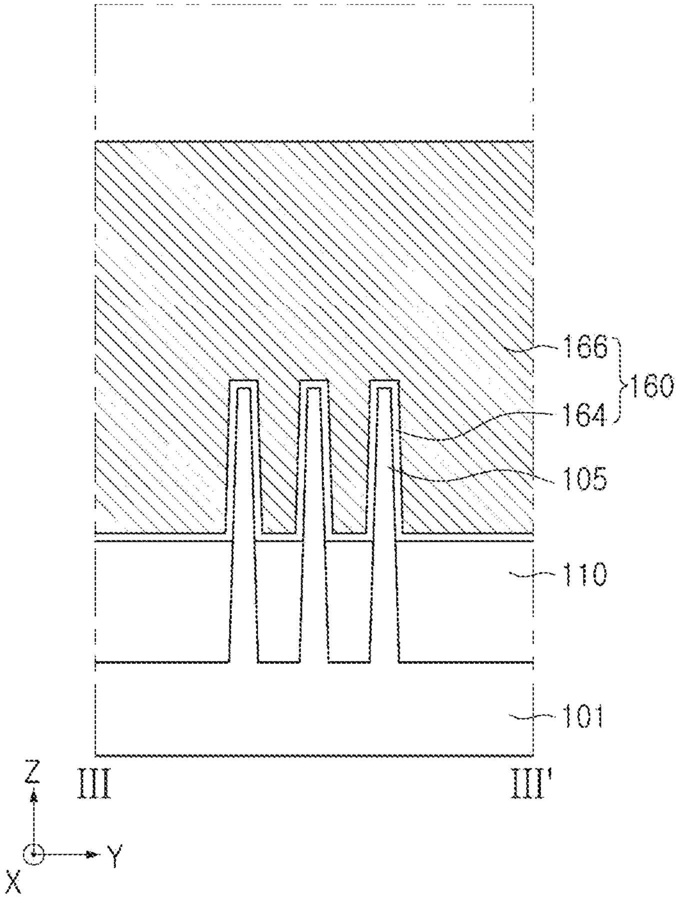

Referring to FIGS. 13A and 13B, the gate structure 160 may be formed by forming the gate dielectric layer 164 and the gate electrode 166 in the openings OP.

The gate dielectric layer 164 may be substantially conformally formed on side surfaces and lower surfaces of the openings OP. The gate dielectric layer 164 may include silicon oxide, silicon nitride, and/or a high-k material. The gate electrode 166 may be formed to fill the openings OP inside the gate dielectric layer 164. The gate electrode 166 may be formed of a metal and/or a semiconductor material.

After the gate dielectric layer 164 and the gate electrode 166 are formed, a material remaining on the interlayer insulating layer 192 may be removed using a planarization process such as a chemical mechanical polishing (CMP) process.

Figure 14A:
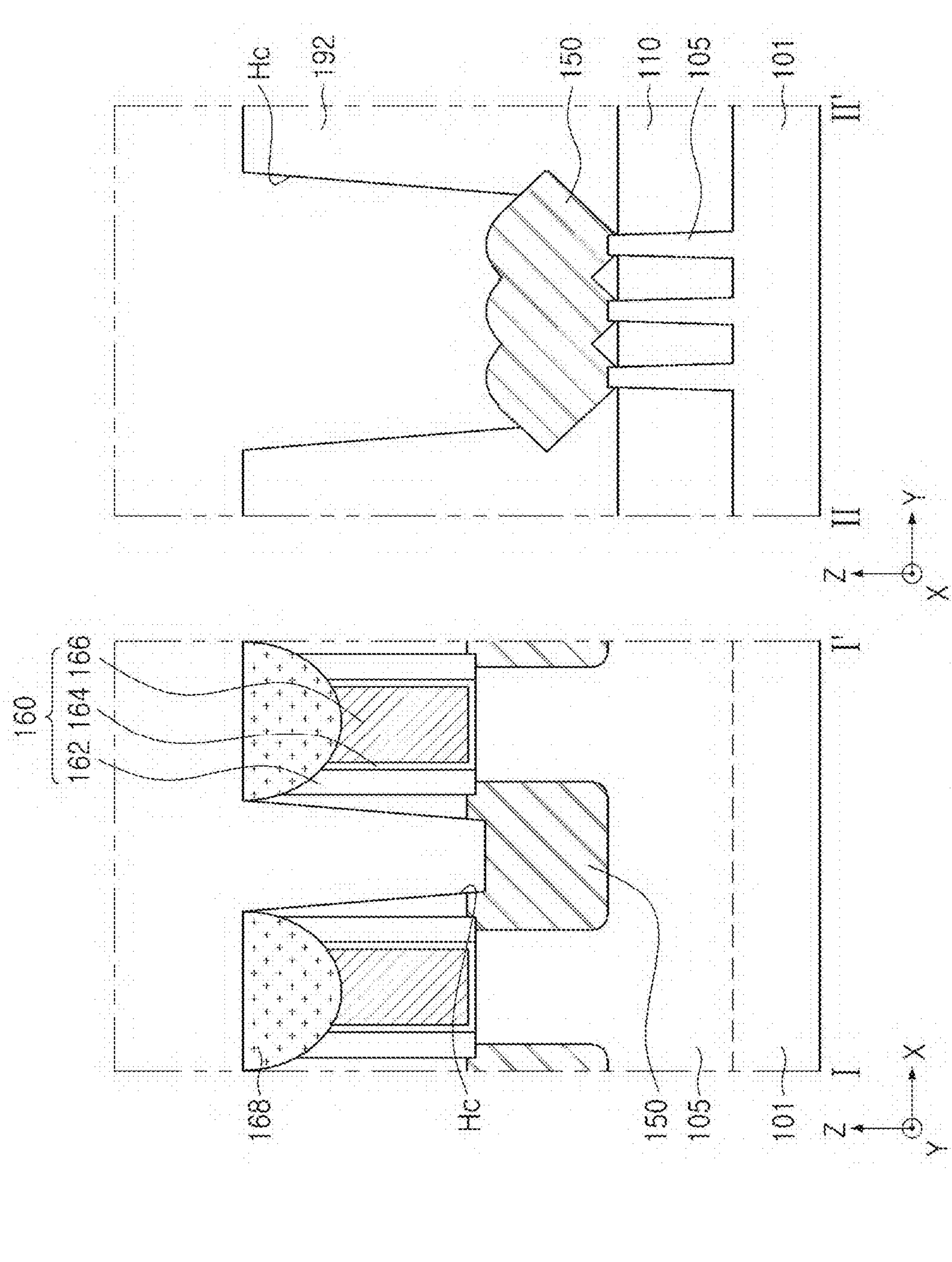
Figure 14B:
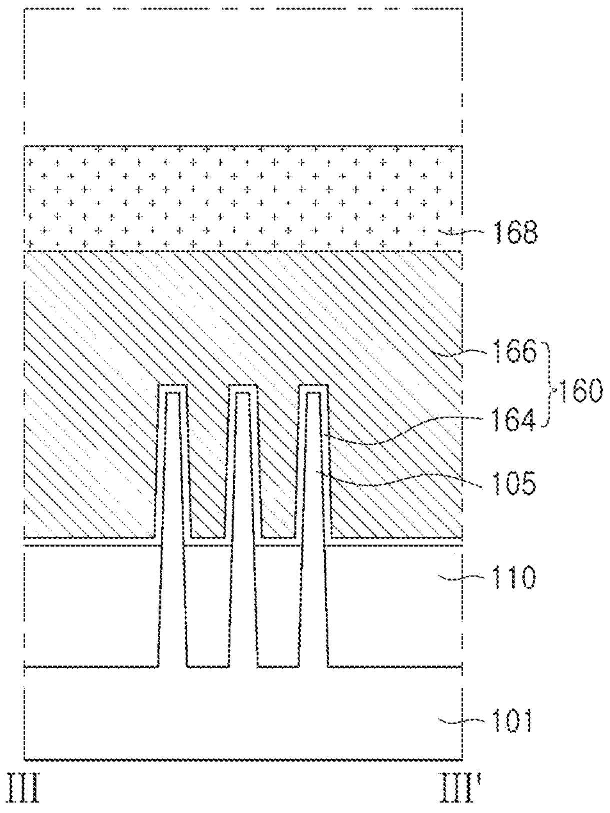

Referring to FIGS. 14A and 14B, gate capping layers 168 may be formed in a region in which the gate structures 160 are partially removed from the top, and a contact hole Hc may be formed.

First, upper regions of the gate structures 160 may be removed by an etching process, an insulating material may be deposited in the region from which the gate structures 160 are removed, and then a planarization process may be performed to form the gate capping layers 168. A width of the gate capping layers 168 in the X-direction may be greater than a width of the gate structures 160 in the X-direction, but the example embodiments are not limited thereto. A lower surface of the gate capping layer 168 may be convex downwardly together with the side surfaces, but is not limited thereto. For example, lower surfaces of the gate capping layers 168 may be flat.

Next, the contact hole Hc may be formed by removing the interlayer insulating layer 192 from the top. The gate capping layers 168 may serve to allow the contact hole Hc to be self-aligned when the contact hole Hc is formed. The gate capping layers 168 may be formed of a material different from that of the interlayer insulating layer 192 (e.g., with different etch selectivity), and when the contact hole Hc is formed, the interlayer insulating layer 192 may be selectively removed with respect to the gate capping layers 168. However, the example embodiments are not limited thereto, and the contact hole Hc may be formed to have an upper width smaller than the interval between the gate capping layers 168 in the X-direction without self-alignment.

Figure 15:
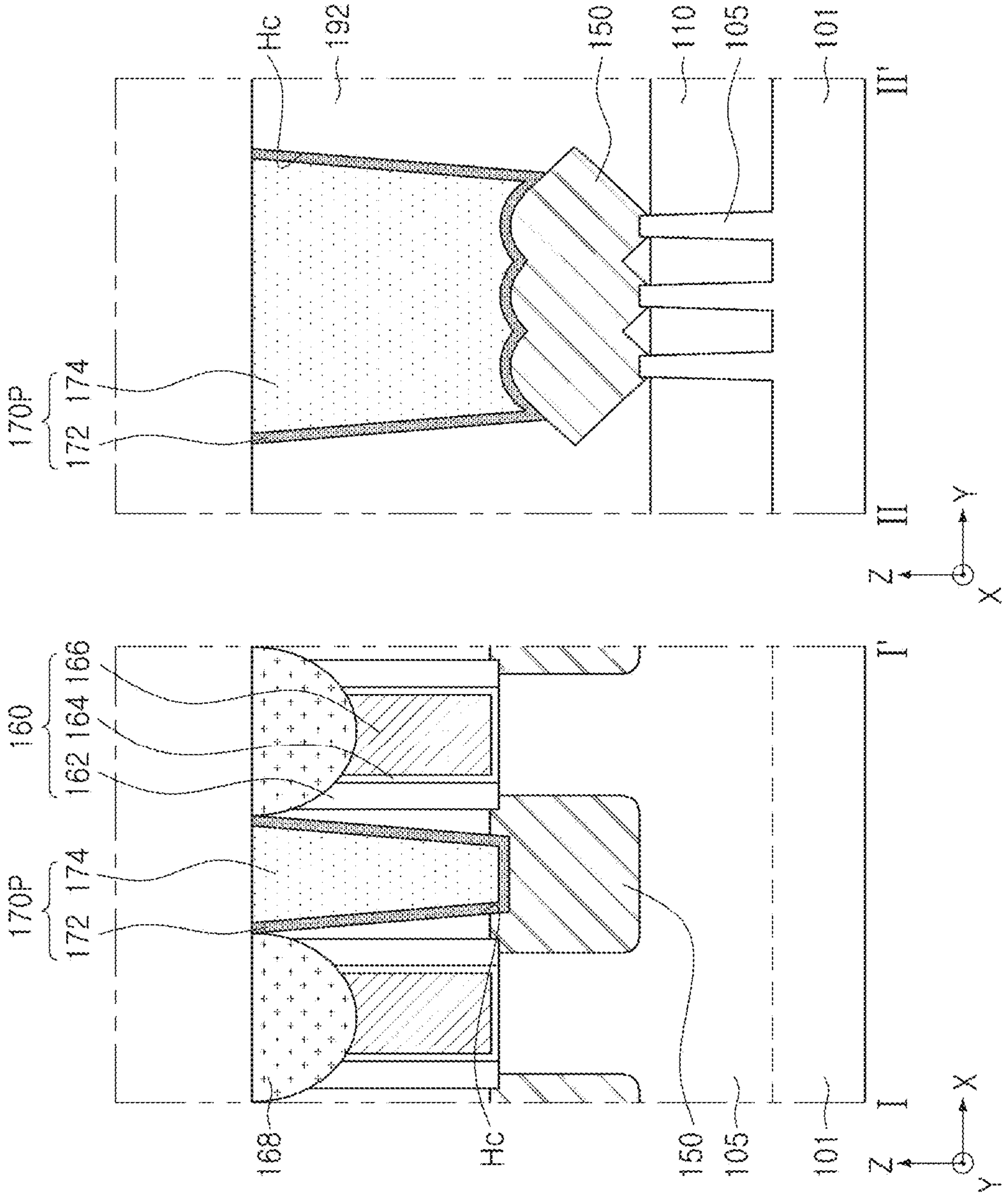

Referring to FIG. 15, the contact hole Hc may be filled with a conductive material to form a preliminary contact structure 170P.

The preliminary contact structure 170P may be formed by performing a deposition process and a planarization process. The preliminary contact structure 170P may be formed to fill the entire contact hole Hc up to the upper end of the contact hole Hc. After the preliminary contact structure 170P is formed, the conductive material remaining on the gate capping layers 168 may be removed using a planarization process. Forming the preliminary contact structure 170P may include sequentially forming the barrier layer 172 and the plug layer 174. The barrier layer 172 may be formed to cover side surfaces and a lower surface of the plug layer 174.

Figure 16A:
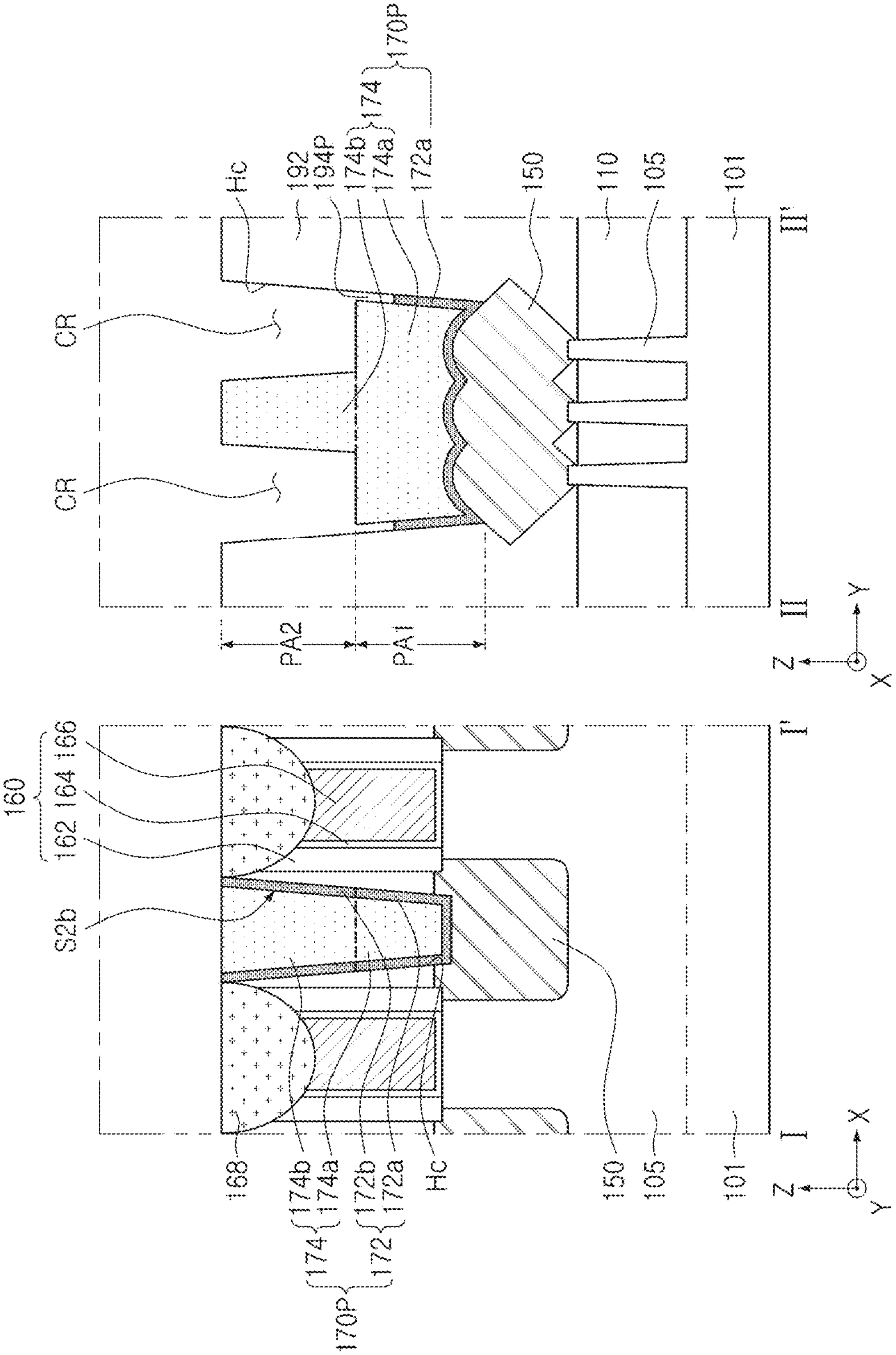
Figure 16B:
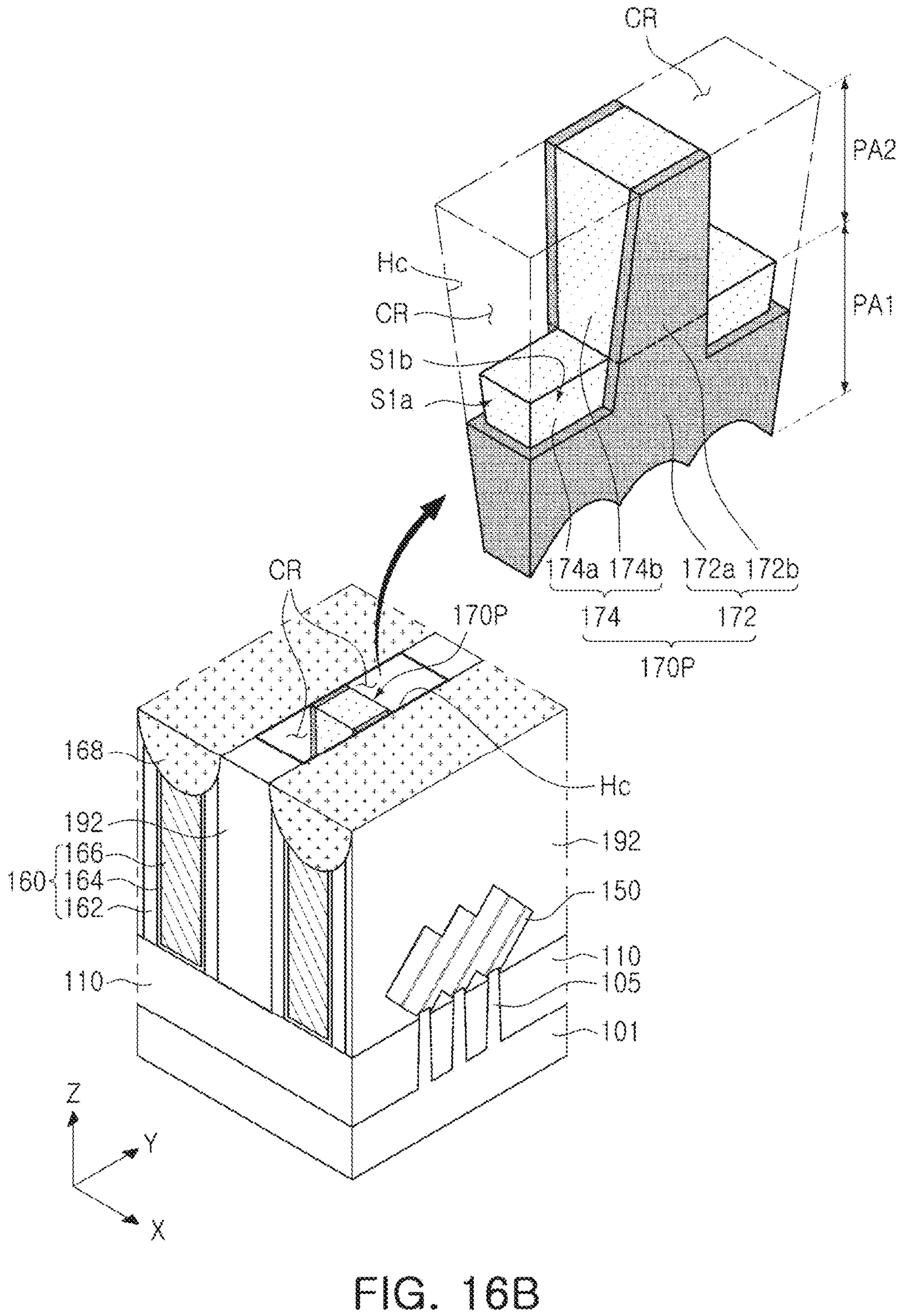

Referring to FIGS. 16A and 16B, the preliminary contact structure 170P may be partially removed from the top to form contact recess regions CR.

First, a mask pattern layer may be formed to expose the preliminary contact structure 170P in a region excluding the region in which the second portion PA2 is to be formed. The mask pattern layer may include a photoresist layer, and may include a hard mask layer and a photoresist layer according to embodiments.

Next, the preliminary contact structure 170P exposed by the mask pattern layer may be partially removed from the top. A portion of the preliminary contact structure 170P may be removed to a predetermined (and/or otherwise determined) depth by a dry etching and/or a wet etching process, and thus only the second portion PA2 may be formed to protrude upwardly. The contact recess regions CR may be formed on both sides of the plug layer 174*b* of the second portion PA2 in the Y-direction. An upper surface of the barrier layer 172*a* of the first portion PA1 may be formed to be lower than an upper surface of the plug layer 174*a* of the first portion PAL Accordingly, the contact recess regions CR may expose upper regions of the side surfaces S1*a* and S1*b* of the plug layer 174*a* of the first portion PA1 as shown in FIG. 16B.

As illustrated in FIG. 16B, the contact recess regions CR may expose both side surfaces of the plug layer 174*b* of the second portion PA2 in the Y-direction. However, in the preliminary contact structure 170P, the barrier layer 172*b* of the second portion PA2 may be in a state of covering both side surfaces of the plug layer 174*b* of the second portion PA2 in the X-direction. In some example embodiments, the contact recess regions CR may be formed only at one end of the contact hole Hc in the Y-direction.

Figure 17A:
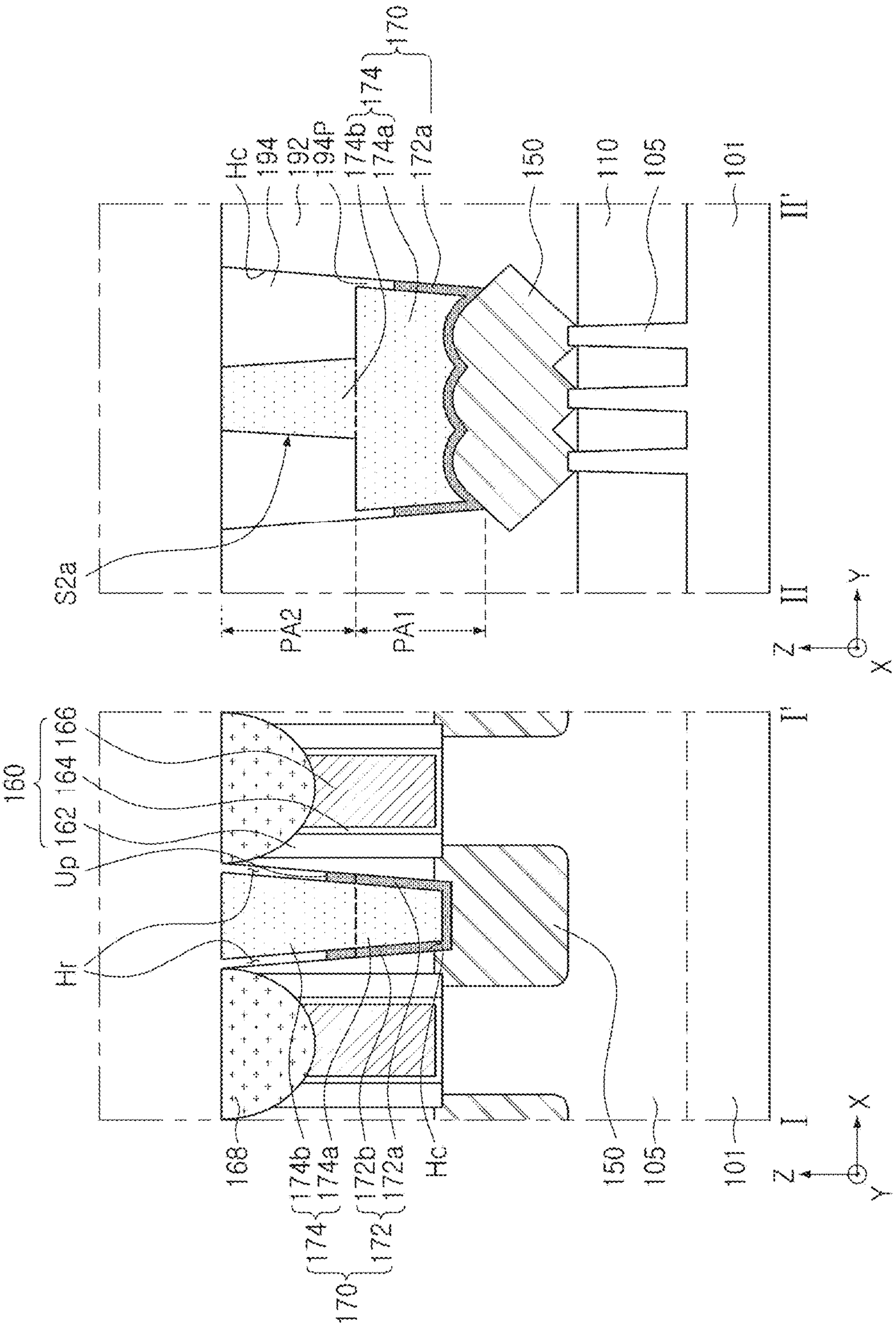
Figure 17B:
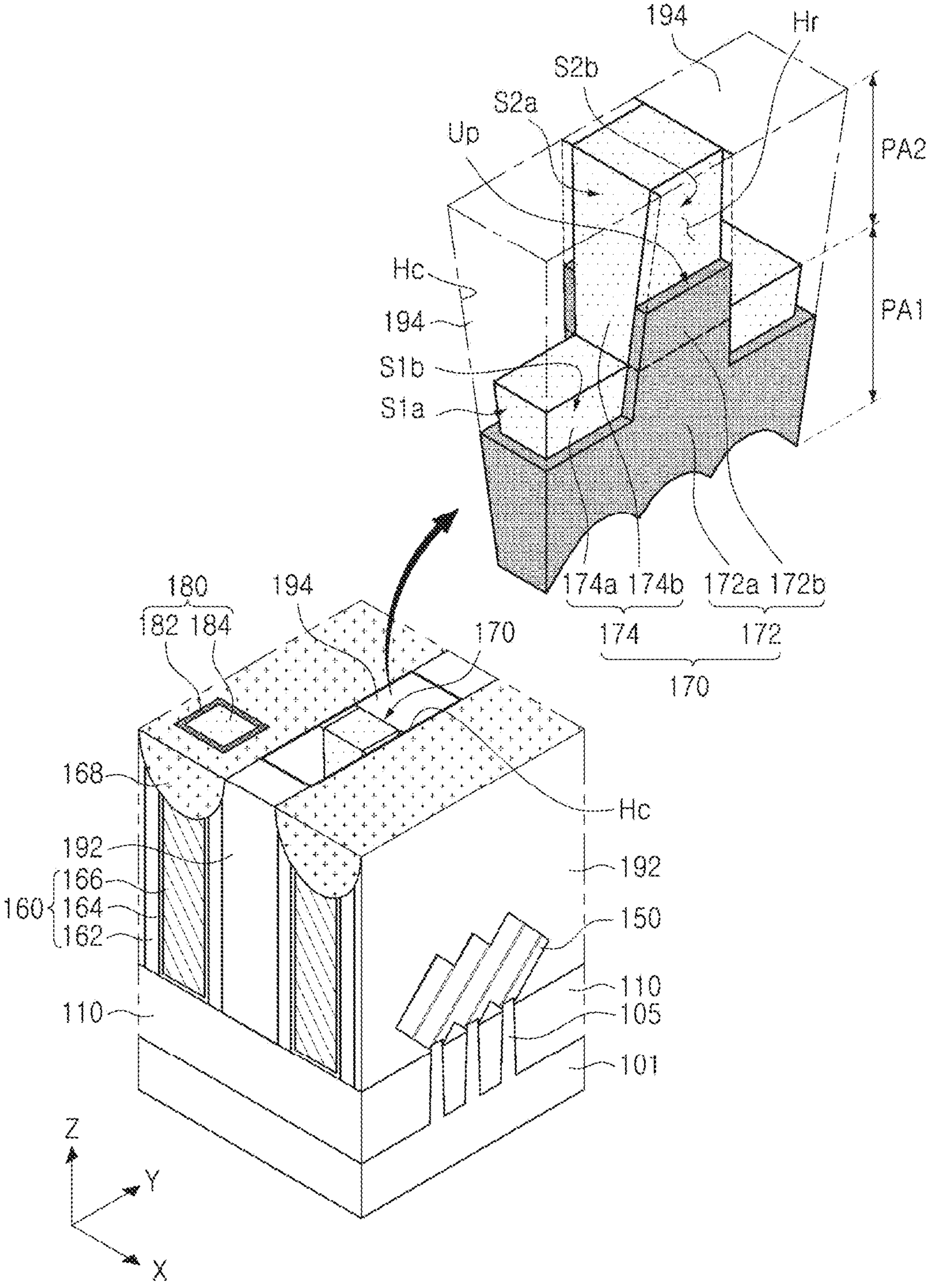

Referring to FIGS. 17A and 17B, an insulating pattern 194 may be formed in the contact recess regions CR, and the barrier layer 172 may be partially removed from the top to form the a contact structure 170.

First, the insulating pattern 194 may be formed by depositing an insulating material to fill the contact recess regions CR, and then removing the insulating material remaining thereon using a planarization process such as a CMP process. By the planarization process, an uppermost surface of the plug layer 174 of the contact structure 170, an upper surface of the gate capping layer 168, and an upper surface of the insulating pattern 194 may be substantially coplanar.

Next, a portion of the barrier layer 172*b* of the second portion PA2 covering both side surfaces S2*b* of the plug layer 174*b* of the second portion PA2 in the X-direction may be removed from the top by a predetermined (and/or otherwise determined) depth to form a hole recess Hr. The plug layer 174*b* of the second portion PA2 may be partially removed by performing an etching process. The etching process may be dry etching and/or wet etching. The insulating pattern 194 may be disposed on both sides of the plug layer 174*b* of the second portion PA2 in the Y-direction so that the plug layer 174*b* of the second portion PA2 may be prevented from collapsing and/or melting, while the hole recess Hr is formed. The barrier layer 172*b* of the second portion PA2 may be selectively removed with respect to the plug layer 174*b* of the second portion PA2 and the insulating pattern 194. Accordingly, side surfaces S2*b* of the plug layer 174*b* of the second portion PA2 in the X-direction may be exposed in the hole recess Hr of the contact hole Hc, and upper ends Up positioned at a level lower than the upper surface of the gate electrode 166 may be formed in the plug layer 174*b* of the second portion PA2.

In this operation, a gate contact structure 180 may be formed. The gate contact structure 180 may be formed by forming a gate contact hole connected to the gate structures 160 through the gate capping layer 168 and then depositing a conductive material. However, in some embodiments, the gate contact structure 180 may be formed together when the preliminary contact structure 170P described above with reference to FIGS. 14A to 15 is formed or before the preliminary contact structure 170P is formed.

Figure 18:
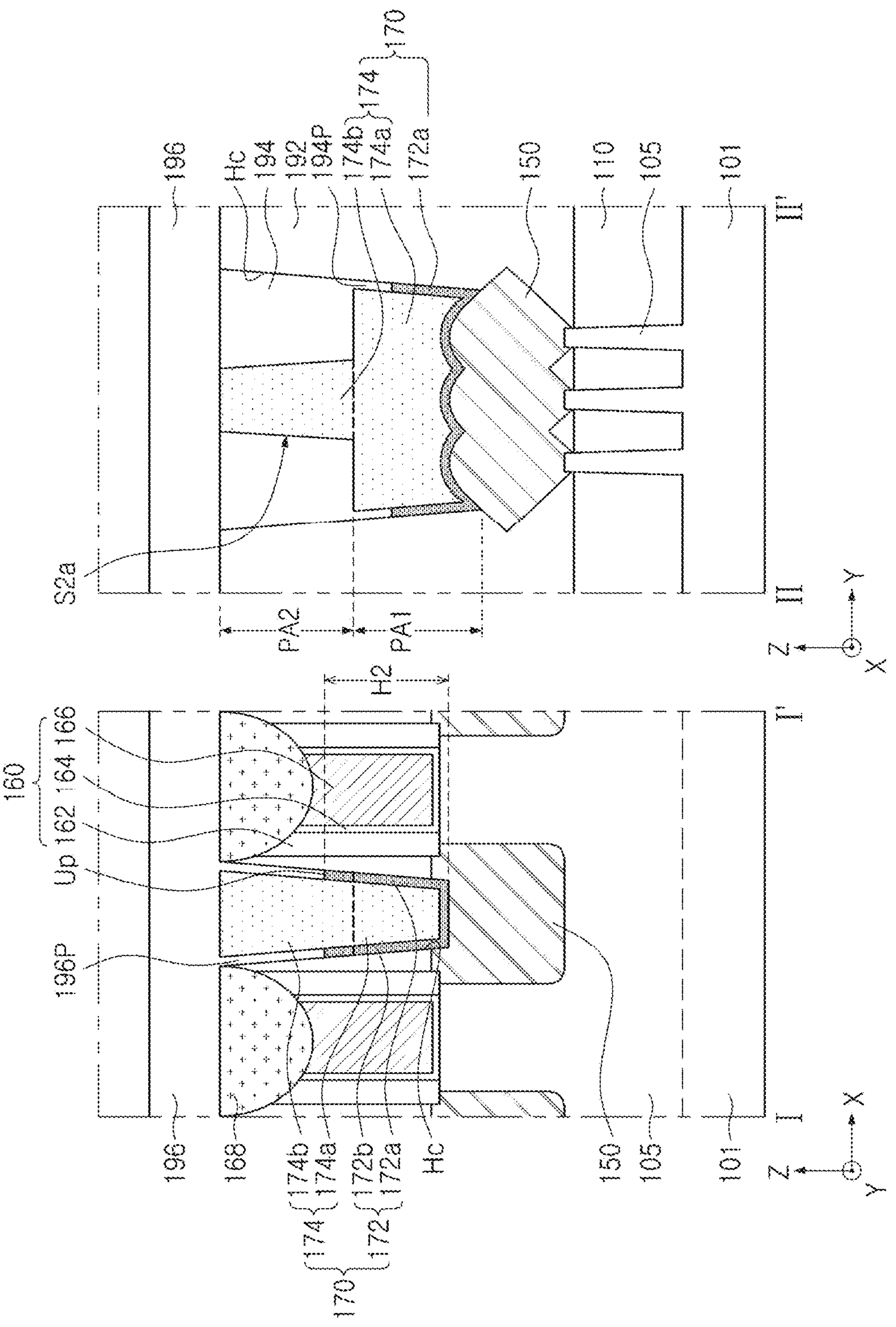

Referring to FIG. 18, the first upper insulating layer 196 may be formed on the gate capping layers 168, the contact structure 170, the gate contact structure 180, the interlayer insulating layer 192, and the insulating pattern 194.

The first upper insulating layer 196 may be formed to fill at least a portion of the hole recess Hr. The first upper insulating layer 196 filling at least a portion of the hole recess Hr may be formed to include a protrusion 168P extending downwardly along both sides of the plug layer 174*b* of the second portion PA2 in the X-direction between the gate capping layers 168. However, the semiconductor device in which the air gap AG2 of FIG. 5 is formed may be manufactured by capping or sealing the upper portion without completely filling the hole recess Hr by the first upper insulating layer 196.

Next, referring to FIGS. 1 to 4, first and second contact vias VA and VB penetrating through the first interlayer insulating layer 196 may be formed, and the second interlayer insulating layer 198 and interconnection layers ML may be formed on the first interlayer insulating layer 196.

The first and second contact vias VA and VB may be formed by partially removing the first interlayer insulating layer 196 using a mask layer to form via holes, and then depositing a conductive material. The plug layer 174 of the contact structure 170 and the gate contact structure 180 may be exposed from lower portions of the via holes. A second interlayer insulating layer 198 may be formed on the first interlayer insulating layer 196, trenches penetrating through the second interlayer insulating layer 198 may be formed, and a conductive material may be deposited to form interconnection layers ML. Accordingly, the semiconductor device 100 of FIGS. 1 to 4 may be manufactured.

As set forth above, by disposing a portion of the barrier layer of the contact structure to be recessed from the top, a distance between the contact structure and the gate structure is secured, thereby providing a semiconductor device having improved electrical characteristics and/or reliability.

Various and beneficial advantages and effects of the present inventive concepts are not limited to the above, and will be more easily understood in the course of describing specific embodiments of the present inventive concepts.

While some example embodiments have been shown and described above, it will be apparent to those skilled in the art that modifications and variations could be made without departing from the scope of the present inventive concept as defined by the appended claims.

What is claimed is:

1. A semiconductor device comprising:

an active region extending in a first direction on a substrate;

a gate structure extending in a second direction and intersecting the active region on the substrate, the gate structure comprising a gate electrode, a gate dielectric layer covering at least one surface of the gate electrode, spacer layers on both sides of the gate electrode, and a gate capping layer on the gate electrode;

source/drain regions on the active region and on at least one side of the gate structure;

a contact structure extending vertically on the substrate and connected to a source/drain region of the source/drain regions, the contact structure comprising a barrier layer and a plug layer; and a contact via on the contact structure, wherein:

the contact structure includes a first portion connected to the source/drain region and a second portion protruding upwardly between the first portion and the contact via, the barrier layer of the first portion covers a lower region of side surfaces of the plug layer of the first portion, the plug layer extends continuously from the first portion through the second portion such that the plug layer has a first height between a lower surface of the plug layer of the first portion and an upper surface of the plug layer of the second portion in a vertical direction, perpendicular to an upper surface of the substrate, the barrier layer has a second height between a lower surface of the barrier layer of the first portion and upper ends of the barrier layer, the upper ends of the barrier layer on both sides of the plug layer of the second portion facing each other in the first direction, such that the barrier layer of the second portion has both of the upper ends at a level lower than the upper surface of the plug layer of the second portion, the second height is less than the first height, a width of the plug layer of the first portion, in the second direction, decreases toward the substrate, and a width of the plug layer of the second portion, in the second direction, increases toward the substrate.

2. The semiconductor device of claim 1, further comprising:

an interlayer insulating layer covering the source/drain regions and including a contact hole through the interlayer insulating layer, the contact hole exposing the source/drain regions in the vertical direction, wherein:

the contact structure is in the contact hole, and the first portion of the contact structure fills a lower portion of the contact hole.

3. The semiconductor device of claim 2, further comprising:

an insulating pattern in at least a portion of a remaining space of the contact hole.

4. The semiconductor device of claim 3, wherein the insulating pattern covers at least one of the upper surface of the plug layer of the first portion or side surfaces of the plug layer of the second portion facing each other in the second direction.

5. The semiconductor device of claim 2, wherein the gate capping layer includes a material different from the interlayer insulating layer, and the contact hole exposes a portion of an upper side surface of the gate capping layer.

6. The semiconductor device of claim 2, further comprising:

an upper insulating layer on the interlayer insulating layer, wherein:

the contact via penetrates through the upper insulating layer in the vertical direction, and the upper insulating layer includes a protrusion extending into the contact hole between the gate capping layer and the plug layer of the second portion.

7. The semiconductor device of claim 6, wherein the upper insulating layer contacts both upper ends of the barrier layer.

8. The semiconductor device of claim 6, further comprising:

an air gap defined by the barrier layer, the plug layer, the interlayer insulating layer, and the protrusion of the upper insulating layer.

9. The semiconductor device of claim 1, wherein the active region includes:

an active fin extending in the first direction on the substrate; and a plurality of channel layers vertically spaced apart from each other, on the active fin, and in a region intersecting the gate structure.

10. The semiconductor device of claim 1, wherein the barrier layer of the second portion has both of the upper ends at a level lower than an upper surface of the gate electrode.

11. A semiconductor device comprising:

an active region extending in a first direction on a substrate;

gate structures extending in a second direction and intersecting the active region on the substrate;

source/drain regions on the active region and on both sides of the gate structures;

an interlayer insulating layer covering the source/drain regions and including a contact hole exposing one of the source/drain regions;

a contact structure, in the contact hole, comprising a barrier layer and a plug layer, wherein the contact structure includes a first portion filling a lower portion of the contact hole and a second portion protruding from a region of the first portion, the plug layer extends continuously from the first portion through the second portion, and the barrier layer of the second portion has upper ends recessed at a level lower than an upper surface of the plug layer of the second portion on both sides of the second portion of the plug layer facing each other in the first direction; and an insulating pattern in a portion of a remaining space of the contact hole excluding the contact structure, wherein a maximal width of the plug layer of the first portion in the second direction is greater than a maximal width of the plug layer of the second portion in the second direction.

12. The semiconductor device of claim 11, wherein the barrier layer of the second portion does not cover upper regions of side surfaces of the plug layer of the second portion.

13. The semiconductor device of claim 11, wherein each of the gate structures comprises a gate electrode, a gate dielectric layer covering a lower surface and a side surface of the gate electrode, spacer layers on both sides of the gate electrode, and a gate capping layer on the gate electrode, the upper ends of the barrier layer of the second portion are at a level lower than an upper surface of the gate electrode, and an upper surface of the plug layer of the first portion is at a level lower than the upper surface of the gate electrode.

14. The semiconductor device of claim 11, wherein the barrier layer of the first portion covers lower regions of side surfaces of the plug layer of the first portion.

15. The semiconductor device of claim 11, wherein a maximal height between a bottom surface and an upper surface of the barrier layer is less than a maximal height between a bottom surface and the upper surface of the plug layer.

16. The semiconductor device of claim 11, wherein an upper surface of the barrier layer of the first portion is at a level lower than an upper surface of the plug layer of the first portion.

17. The semiconductor device of claim 11, wherein the barrier layer of the second portion has the upper ends recessed at a level lower than an upper surface of a gate electrode.

18. A semiconductor device comprising:

an active region extending in a first direction on a substrate;

a gate structure extending in a second direction and intersecting the active region, the gate structure comprising a gate electrode, spacer layers on both sides of the gate electrode, and a gate capping layer on the gate electrode;

source/drain regions on the active region and on both sides of the gate structure; and contact structures connected to the source/drain regions and comprising a barrier layer and a plug layer, each of the contact structures including a first portion connected to the source/drain regions and a second portion protruding upwardly from a region of the first portion, wherein the plug layer extends continuously from the first portion to the second portion, wherein the barrier layer of the second portion has upper ends, recessed at a level lower than an upper surface of the plug layer of the second portion, on both sides of the plug layer of the second portion and facing each other in the first direction, wherein a maximal height of the barrier layer between a bottom surface and an upper surface of the barrier layer is less than a maximal height of the plug layer between a bottom surface and an upper surface of the plug layer, and wherein a width of the plug layer of the first portion, in the second direction, decreases toward the substrate and a width of the plug layer of the second portion, in the second direction, increases toward the substrate.

19. The semiconductor device of claim 18, wherein:

the barrier layer of the second portion does not cover upper regions of side surfaces of the plug layer of the second portion, and the barrier layer of the first portion covers lower regions of the side surfaces of the plug layer of the first portion.

* * * * *